(12) United States Patent
Yoshihara et al.

(10) Patent No.: US 9,511,574 B2
(45) Date of Patent: Dec. 6, 2016

(54) METHOD AND APPARATUS FOR BONDING WORKPIECES TOGETHER

(75) Inventors: Keita Yoshihara, Hyogo (JP); Shinji Suzuki, Tokyo (JP); Kinichi Morita, Tokyo (JP); Hideki Fujitsugu, Hyogo (JP)

(73) Assignee: USHIO DENKI KABUSHIKI KAISHA, Tokyo (JP)

( * ) Notice: Subject to any disclaimer, the term of this patent is extended or adjusted under 35 U.S.C. 154(b) by 87 days.

(21) Appl. No.: 14/111,548

(22) PCT Filed: Apr. 12, 2012

(86) PCT No.: PCT/JP2012/059990
§ 371 (c)(1),
(2), (4) Date: Oct. 12, 2013

(87) PCT Pub. No.: WO2012/144408
PCT Pub. Date: Oct. 26, 2012

(65) Prior Publication Data
US 2014/0027054 A1 Jan. 30, 2014

(30) Foreign Application Priority Data
Apr. 20, 2011 (JP) .................. 2011-094070

(51) Int. Cl.
*B32B 37/14* (2006.01)
*B29C 65/14* (2006.01)
(Continued)

(52) U.S. Cl.
CPC ........ *B32B 37/144* (2013.01); *B01L 3/502707* (2013.01); *B29C 65/1406* (2013.01);
(Continued)

(58) Field of Classification Search
CPC .............. B29C 65/18; B29C 65/7847; B29C 65/1406; B29C 66/8324; B29C 66/8322; B29C 66/8161; B29C 66/91421; B32B 37/00
See application file for complete search history.

(56) References Cited

U.S. PATENT DOCUMENTS 5,951,806 A * 9/1999 Amo .................. G11B 7/26
156/273.5
7,073,554 B1 * 7/2006 Lin ................... B29C 65/521
156/539

(Continued)

FOREIGN PATENT DOCUMENTS

JP           3714338 B2    11/2005
JP       2006-187730 A      7/2006

(Continued)

OTHER PUBLICATIONS

International Search Report for PCT/JP2012/059990, Jul. 3, 2012.

*Primary Examiner* — Daniel McNally

(57) ABSTRACT

Two workpieces composed of a resin workpiece and a resin workpiece, or composed of a resin workpiece and a glass substrate are bonded to each other such that troubles, such as an alignment shift and breakage etc. are not generated, while ensuring bonding uniformity. A first workpiece is placed on an inverting stage of an inverting stage unit, a second workpiece is placed on a work stage of a pressurizing stage unit, and UV light is radiated from a light irradiation unit. Then, the inverting stage is inverted 180°, the workpieces are overlapped each other on the work stage, and the workpieces are pressurized and pre-bonded to each other. Then, the workpieces in the pre-bonded state are transferred to a heating stage by a transfer means, the temperature of the workpieces is increased to a predetermined temperature by heating the workpieces, and the temperature is maintained until bonding is completed.

8 Claims, 12 Drawing Sheets

(51) Int. Cl.

| | | |
|---|---|---|
| *B29C 65/18* | (2006.01) | |
| *B29C 65/78* | (2006.01) | |
| *B32B 37/10* | (2006.01) | |
| *B01L 3/00* | (2006.01) | |
| *B32B 37/00* | (2006.01) | |
| *B32B 37/06* | (2006.01) | |
| *B81C 3/00* | (2006.01) | |
| *B29C 65/00* | (2006.01) | |
| *B32B 38/18* | (2006.01) | |
| *B29L 31/00* | (2006.01) | |

(52) U.S. Cl.
CPC ....... *B29C65/1432* (2013.01); *B29C 65/1464* (2013.01); *B29C 65/1467* (2013.01); *B29C 65/18* (2013.01); *B29C 65/7847* (2013.01); *B29C 65/7876* (2013.01); *B29C 66/028* (2013.01); *B29C 66/45* (2013.01); *B29C 66/53461* (2013.01); *B29C 66/54* (2013.01); *B29C 66/73112* (2013.01); *B29C 66/7465* (2013.01); *B29C 66/8161* (2013.01); *B29C 66/8322* (2013.01); *B29C 66/8324* (2013.01); *B29C 66/9141* (2013.01); *B29C 66/91231* (2013.01); *B29C 66/91421* (2013.01); *B29C 66/91431* (2013.01); *B29C 66/91445* (2013.01); *B29C 66/91641* (2013.01); *B29C 66/929* (2013.01); *B29C 66/9221* (2013.01); *B29C 66/92445* (2013.01); *B29C 66/92611* (2013.01); *B29C 66/92653* (2013.01); *B29C 66/92655* (2013.01); *B32B 37/0046* (2013.01); *B32B 37/06* (2013.01); *B32B 37/10* (2013.01); *B32B 37/14* (2013.01); *B81C 3/001* (2013.01); *B01J 2219/00808* (2013.01); *B01L 2200/0689* (2013.01); *B01L 2300/0816* (2013.01); *B29C 66/0242* (2013.01); *B29C 66/71* (2013.01); *B29C 66/73921* (2013.01); *B29C 66/81811* (2013.01); *B29C 66/961* (2013.01); *B29L 2031/756* (2013.01); *B32B 38/1858* (2013.01); *B32B 2310/0831* (2013.01); *B81C 2203/036* (2013.01)

(56) References Cited

U.S. PATENT DOCUMENTS

| | | | |
|---|---|---|---|
| 2002/0108715 A1* | 8/2002 | Higaki et al. | 156/379.6 |
| 2004/0211511 A1* | 10/2004 | Suzuki | C08J 5/12 156/273.3 |
| 2004/0242023 A1* | 12/2004 | Yan | B82Y 30/00 506/12 |
| 2005/0079373 A1* | 4/2005 | Gmur | 428/523 |
| 2005/0236091 A1* | 10/2005 | Kanoh | H01L 27/1214 156/154 |
| 2006/0027318 A1* | 2/2006 | Hashizume et al. | 156/285 |
| 2008/0014712 A1* | 1/2008 | Bourdelle | H01L 21/187 438/455 |
| 2009/0214856 A1* | 8/2009 | Gomi | B29C 65/1406 428/332 |
| 2010/0193120 A1 | 8/2010 | Matsuo | |

FOREIGN PATENT DOCUMENTS

| | | |
|---|---|---|
| JP | 2008-19348 A | 1/2008 |
| JP | 2009-023337 A | 2/2009 |
| WO | 2008/087800 A1 | 7/2008 |

\* cited by examiner (a)

(b)

METHOD AND APPARATUS FOR BONDING WORKPIECES TOGETHER

TECHNICAL FIELD

The present invention relates to a method and an apparatus for bonding resin substrate workpieces together or resin and glass substrate workpieces together, and more particularly, to a method and an apparatus for bonding workpieces together, at least one of the workpieces having a fine flow path.

BACKGROUND ART

In recent years, attention has been focused on a technique, e.g., for separating, synthesizing, extracting, and analyzing a trace amount of reagent using a micro-reactor made up of a microchip, which includes a micro-scale analyzing channel formed by the semiconductor micromachining technique on a small substrate that is composed of silicon, silicone, or glass.

A reaction analysis system employing such a micro-reactor is referred to as a micro total analysis system (hereafter referred to as the "μTAS"). According to the μTAS, for example, the ratio of surface area to volume of the reagent is increased, thereby enabling reaction analysis to be performed at high speeds with high precision and implementing a compact automatized system.

The microchip may be provided, in a flow path also called a microchannel, with regions having various types of functions such as a reaction region in which a reagent is disposed, thereby constituting a chip suitable for various uses. The representative uses of the microchip may include analyses in the fields of chemistry, biochemistry, pharmacy, medicine, and veterinary medicine, such as genetic analysis, clinical diagnosis, and drug screening; synthesis of compounds; and environmental measurements.

The aforementioned microchip is typically constructed to have a pair of substrates which are opposed and adhered to each other, with a fine flow path (e.g., approximately ten to a few hundreds of micrometers in width and ten to a few hundreds of micrometers in depth) formed on a surface of at least one of the substrates. The microchip has been constituted mainly of a glass substrate because the glass substrate can be manufactured with ease and permit optical detection. Furthermore, recently, such a microchip has been under development which employs a resin substrate that is lighter, more inexpensive, and more resistant to damage than the glass substrate.

For microchips, bonding may be thought to be performed by means of adhesive or by heat fusion. However, both the methods are not preferred for the following reasons.

The use of adhesive would cause the adhesive to exude to the micro flow path, thereby blocking the flow path, narrowing part of the micro flow path so as to make the flow path uneven, and causing disturbances in the homogeneous characteristics of the wall surface of the flow path.

Furthermore, in the case of the heat fusion, fusion at a thermal melting point or higher would cause, for example, the flow path to be collapsed at a heating stage or the flow path not to be retained in a predetermined cross-sectional shape. Thus, the adhesion by heat fusion would cause a higher performance microchip to be implemented with difficulty.

In this context, in recent years, there has been a more general method in which a surface of substrates is irradiated with vacuum ultraviolet light so as to activate the substrate surface, and then the substrates are bonded together.

For example, proposed in Patent Literature 1 is a method which is used to bond a plurality of microchip substrates made of a resin, the method being configured, for example, such that a substrate surface of at least one of two resin substrates made of, e.g., cyclo olefin polymer (COP) is irradiated with light from an excimer lamp having an emission line at a wavelength of 172 nm; and then both the substrates are stacked one on the other so as to be heated to a temperature less than a plastic deformation point, or alternatively to join both the substrates together by applying pressure thereto without heating the substrates.

Furthermore, proposed in Patent Literature 2 is a method for irradiating a respective surface of two resin substrates made of, e.g., COP with vacuum ultraviolet light at a wavelength of 172 nm so as to heat the substrates while the irradiated surfaces are in contact with each other, thereby adhering the substrates together. Note that the heating step may also be performed while force is being applied to the substrates in a direction in which the surfaces are brought into intimate contact with each other.

Furthermore, proposed in Patent Literature 3 is a method for irradiating a respective surface of two resin substrates made of, e.g., COP or PMMA (Polymethyl methacrylate) with vacuum ultraviolet light at a wavelength of 172 nm and then allowing the irradiated surfaces to be stacked one on the other, so that both the substrates are adhered together while both the substrates are being pressurized.

CITATION LIST

Patent Literature

Patent Literature 1: Japanese Patent Application Laid-Open No. 2006-187730
Patent Literature 2: Japanese Patent Application Laid-Open No. 2008-19348
Patent Literature 3: International Publication Pamphlet No. WO2008/087800A1

SUMMARY OF INVENTION

Technical Problem

As a result of intensive studies made by the inventors, the following were found concerning the conventional bonding methods described above.

As disclosed in Patent Literature 1 and Patent Literature 3, the surfaces of microchip substrates made of a resin are irradiated, for example, with vacuum ultraviolet light at a wavelength of 172 nm and the irradiated surfaces are placed one on the other after the irradiation with the light and then pressurized, thereby joining both the microchip substrates together. In this case, it was found that both the microchip substrates were not always uniformly joined together, but some regions of the substrate surfaces were sufficiently joined together but at the same time the other regions were insufficiently joined together. Although the reason for this has not been made clear yet, this is thought to be possibly due to the fact that since at least one of the microchip substrates includes, a groove that forms a flow path at the time of being joined together, and regions having the groove formed are unevenly distributed on the surface of the microchip substrate, both the microchip substrates were not always uniformly pressurized.

Even if pressure is not uniformly applied, a relatively high pressure applied to both the microchip substrates would eliminate those regions at which the joined surfaces would be otherwise insufficiently joined together. However, in that case, there is a possibility that the following problems may occur.

As described above, the microchip is constructed such that a pair of substrates are opposed to each other and joined together, and at least one of the substrates is provided with a fine flow path formed on a surface thereof (e.g., about ten to a few hundreds of micrometers in width and ten to a few hundreds of micrometers in depth). In particular, when both of the pair of substrates are each provided with a fine groove and superimposed to form one flow path by each of the opposed grooves, both the microchip substrates have to be positioned (aligned) with each other with high accuracy at the time of superimposing both the microchip substrates.

Here, an increase in pressure to be applied to both the microchip substrates would possibly cause both the microchip substrates to be distorted. In particular, if both the microchip substrates are made of a resin such as COP, there would be an increased possibility that applying pressure will cause distortion. A distortion of both the microchip substrates would cause both the microchip substrates to be misaligned as well as the flow path itself to be distorted.

Furthermore, as disclosed in Patent Literature 2, a surface of a microchip substrate made of a resin is irradiated, for example, with vacuum ultraviolet light at a wavelength of 172 nm, and then both the substrates are heated and joined together while each of the irradiated surfaces are in contact with each other. In this case, the following problems may occur.

When the surfaces of each microchip substrate after having been irradiated with vacuum ultraviolet light are heated as described above while the surfaces are in contact with each other, each microchip substrate will be thermally expanded. In particular, when the two microchip substrates are made of different types of material, the microchip substrates are each thermally expanded to a different extent due to their mutually different coefficients of thermal expansion. Thus, even when the two microchip substrates are aligned and stacked one on the other with high accuracy, the fine grooves formed in the respective surface of the two microchip substrates are misaligned when being heated, resulting in the shape of the flow path being distorted.

In particular, when the microchip substrates stacked in layers are heated as a whole to 100° C. and held for one hour as they are as disclosed in Patent Literature 2, there will be an increased probability that such a problem with the formation of the flow path may occur.

The present invention was developed in view of the aforementioned circumstances. It is thus an object of the invention to provide a method for bonding and joining together two resin substrates or resin and glass substrates (workpieces), the method enabling the substrates to be joined together uniformly and preventing problems such as a misalignment due to application of pressure or thermal expansion. It is another object of the invention to provide a workpiece bonding apparatus for carrying out the method.

Solution to Problem

According to the present invention, to address the aforementioned problems, the workpiece bonding is carried out as follows to bond together first and second workpieces which are either resin substrates or resin and glass substrates with a fine flow path formed on at least one of the workpieces.

[Step 1] The surfaces to be joined together of a pair of workpieces (e.g., microchip substrates) with a fine flow path formed on at least one of the workpieces are irradiated with vacuum ultraviolet light at a wavelength of 200 nm or less. Note that either both or one of the surfaces to be joined together of the workpieces may be irradiated with the vacuum ultraviolet light.

In this step, the surfaces to be joined together are irradiated with the vacuum ultraviolet light and thereby activated.

[Step 2]

The surfaces to be joined together which have been irradiated with the vacuum ultraviolet light are opposed to and aligned with each other, and after the alignment, stacked in layers so that the surfaces to be joined together are brought into contact with each other.

[Step 3]

The pair of workpieces stacked in layers are pressurized and held under pressure for a predetermined time. Note that the pressure being applied is set so as not to deform the workpieces.

The activated surfaces are joined together by the application of pressure. Here, the predetermined time mentioned above refers to the time which is required for both the workpieces to be joined together though some regions of the joined surfaces are sufficiently joined together but at the same time the other regions are insufficiently joined together.

That is, in Step 3, the pair of two workpieces are "temporarily joined together."

[Step 4]

The pressure being applied is released after the application of the pressure for the predetermined time, and the workpieces which have been "temporarily joined together" are heated to a predetermined temperature of the workpieces and then sustained at this temperature until the workpieces are completely joined together. Here, the predetermined temperature refers to the temperature at the level of which the workpieces will not be distorted, and "being completely joined together" refers to the state in which the regions insufficiently joined together on the joined surfaces after the end of [Step 3] have been sufficiently joined together.

That is, the present invention is characterized in that surfaces to be joined together of a pair of workpieces are irradiated with vacuum ultraviolet light at a wavelength of 200 nm or less; the surfaces to be joined together which are irradiated with the vacuum ultraviolet light are opposed to and aligned with each other and then placed one on the other so that the surfaces to be joined together are brought into contact with each other; the pair of workpieces stacked in layers are pressurized and then held under pressure for a predetermined time; and after the pressure being applied is released, the workpieces are heated to a predetermined temperature and then held at this temperature until the workpieces are completely joined together. In this manner, by heating the workpieces after the pressure being applied is released, either resin substrate workpieces or resin and glass substrate workpieces can be well joined together without causing the problems with the formation of the flow path as described in the conventional example above.

That is, the present invention addresses the problems as follows.

(1) In a method for bonding first and second resin workpieces or resin and glass workpieces together, at least one of surfaces to be bonded together of both the workpieces is irradiated with ultraviolet light; after the irradiation with the light, both the workpieces are stacked one on the other so that the surfaces of the workpieces to be bonded together are brought into contact with each other; pressure is applied to both the workpieces so as to pressurize the contact surfaces; and after the pressure being applied is released, both the workpieces are heated.

(2) In (1) above, both the workpieces are heated by heating means, and the heating means is pre-heated.

(3) In (1) or (2) above, both the workpieces are microchip substrates, and at least one of the workpieces is provided with a fine flow path.

(4) An apparatus for bonding first and second resin workpieces or resin and glass workpieces together is constructed to include the following:

a stage for holding the first workpiece; a light irradiation unit for irradiating, with ultraviolet light, a surface of the first workpiece held on the stage; a movement restricting mechanism for restricting at least a vertical movement of the first and second workpieces which are stacked in layers in a state that one surface of the second workpiece is brought into contact with the surface of the first workpiece held on the stage irradiated with the light; a pressurizing mechanism for pressurizing the first and second workpieces stacked in layers so that the contact surfaces thereof are pressurized; and a heating mechanism which is provided separately from the stage and which, after the pressure being applied is released, heats the first and second workpieces stacked in layers.

(5) An apparatus for bonding first and second resin workpieces or resin and glass workpieces together is constructed to include the following:

a first stage for holding the first workpiece; a second stage for holding the second workpiece; a light irradiation unit for irradiating a surface of the first workpiece and/or a surface of the second workpiece with ultraviolet light; a workpiece stacking mechanism for stacking in layers both the workpieces so that the light-irradiated surface of at least one of the first and second workpieces respectively held on the first and second stages is brought into contact with the surface or the light-irradiated surface of the other of the workpieces; a movement restricting mechanism for restricting at least a vertical movement of the first and second workpieces stacked in layers; a pressurizing mechanism for pressurizing the first and second workpieces stacked in layers in a state that the contact surfaces thereof are pressurized; a gap setting mechanism for allowing a distance between the light irradiation unit and the surface of the first workpiece held on the first stage and/or the surface of the second workpiece held on the second stage to be independently adjusted; and a heating mechanism which is provided separately from the first and second stages and which, after the pressure being applied is released, heats the first and second workpieces stacked in layers.

(6) In (4) or (5) above, the heating mechanism is constituted by a heating stage on which the workpiece is placed.

(7) In (5) or (6) above, both the workpieces are microchip substrates, and at least one of the workpieces is provided with a fine flow path.

Advantageous Effects of Invention

According to the method of the present invention for bonding workpieces together, surfaces of a pair of workpieces to be joined together are irradiated with vacuum ultraviolet light ([Step 1]); the workpieces are aligned with each other ([Step 2]); and then both the workpieces are first pressurized ([Step 3]). In Step 3, since both the workpieces are not heated, both the workpieces will never be distorted due to heat. Furthermore, naturally, there will occur no misalignment which would be otherwise caused by the difference between the thermal expansion coefficients of the pair of workpieces when the workpieces are made of mutually different materials. For example, when the workpieces are a microchip substrate, it is possible to avoid the problem with the formation of a micro flow path resulting from the misalignment.

Furthermore, Step 3 is a "temporarily joining" step as described above. Thus, the pressure to be applied needs not to be increased in order to resolve the occurrence of an insufficiently joined region on the joined surfaces, thus leading to no distortion of the workpieces due to the application of pressure. For example, even when the workpieces are a pair of microchip substrates made of a resin such as COP, it is possible to prevent problems such as the misalignment of both the microchip substrates and the deformation of the micro flow path itself caused by the distortion of the microchip substrates. Furthermore, in Step 3, since the workpieces have to be joined together only to some extent, it is not necessary to apply pressure for a long time. That is, it is possible to reduce the time for applying pressure when compared with the time spent for the pressurizing step in the conventional bonding method.

In [Step 4] subsequent to [Step 3], with the applied pressure released, the "temporarily joined" workpieces are heated to a predetermined workpiece temperature and then sustained at this temperature until the workpieces are completely joined together. In [Step 3], the workpieces are partially joined together to a sufficient degree. Thus, the heating step of [Step 4] is only performed until an insufficiently joined region present on the joined surfaces is sufficiently joined together. It is thus possible to reduce the time for heating when compared with the time spent for the heating step in the conventional bonding method.

Furthermore, since the workpieces have already been "temporarily joined together" in [Step 3] and the predetermined temperature in [Step 4] is a temperature at the level of which the workpieces will never be distorted, the pair of workpieces will be neither misaligned nor distorted. Since the heating time can be reduced as described above and the two microchip substrates have already been "temporarily joined together," the misalignment of the two workpieces which would otherwise result from mutually different degrees of thermal expansion of each workpiece is suppressed even when the substrates are made of different types of material and thus have mutually different coefficients of thermal expansion.

For example, even when the workpieces are a pair of microchip substrates made of a resin such as COP, the misalignment of both the microchip substrates caused by the distortion of the microchip substrates is suppressed. It is thus possible to prevent the problem with the shape of the flow path and the problem such as the distortion of the flow path itself, the problems resulting from the mutual positional displacement of the fine grooves formed on the respective surfaces of the two microchip substrates.

DESCRIPTION OF EMBODIMENTS

I. Bonding Apparatus

Now, a description will be made to a bonding apparatus according to an embodiment for carrying out a method for bonding workpieces together according to the present invention.

The workpiece bonding apparatus is mainly made up of the following: A. a light irradiation, workpiece stacking, and pressurizing mechanism; B. a workpiece transfer mechanism; and C. a workpiece heating mechanism.

The light irradiation and workpiece pressurizing mechanism is configured to perform [Step 1], [Step 2], and [Step 3] mentioned above. On the other hand, the workpiece heating mechanism is configured to perform [Step 4]. Note that the workpiece transfer mechanism serves to transfer workpieces, which have undergone [Step 1] through [Step 3] by the light irradiation and workpiece pressurizing mechanism, to the workpiece heating mechanism.

A. Light Irradiation, Workpiece Stacking, and Pressurizing Mechanism

Figure 1:
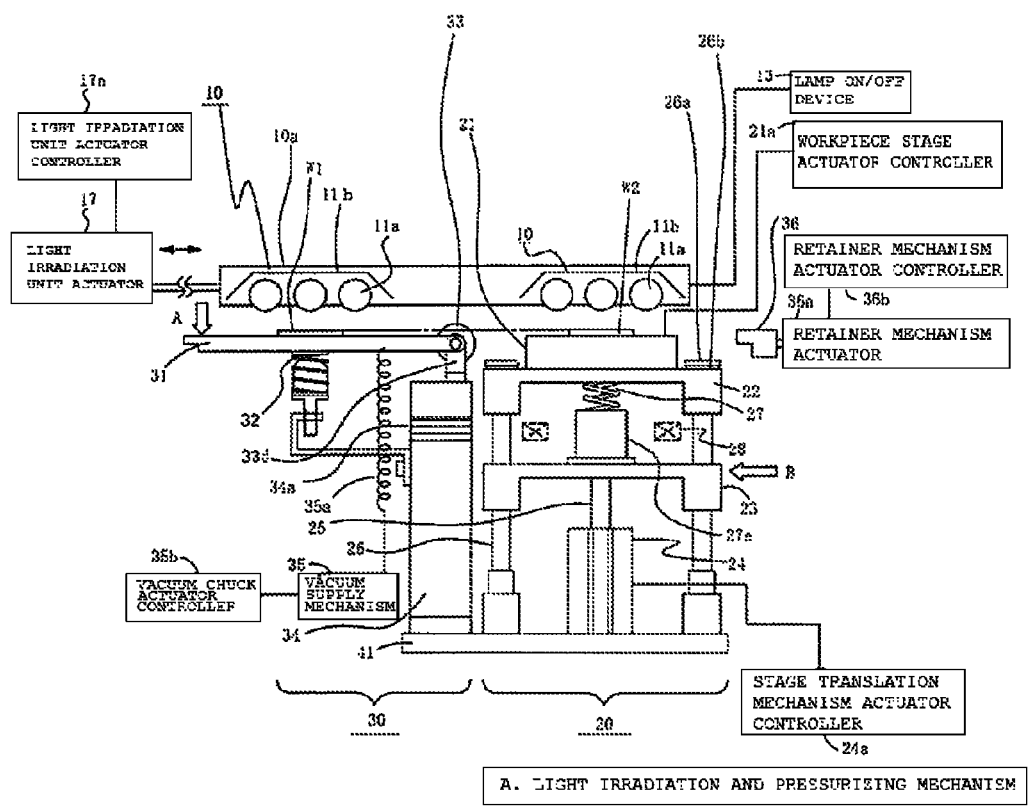
FIG. 1 is a view illustrating an example of the structure of an apparatus according to an embodiment of the present invention.

FIG. 1 shows an example of the structure of the light irradiation, workpiece stacking, and pressurizing mechanism.

As shown in FIG. 1, the light irradiation, workpiece stacking, and pressurizing mechanism is made up of three units: a light irradiation unit 10; a pressurizing stage unit 20 (pressurizing mechanism) provided on a base 41; and an inverting stage unit 30 (workpiece stacking mechanism).

a. Light Irradiation Unit 10

The light irradiation unit 10 serves to irradiate and activate a surface (surface to be joined) of a first workpiece W1 and a surface (surface to be joined) of a second workpiece W2 with vacuum ultraviolet light. The light irradiation unit 10 is made up of at least one or more lamps 11a; a reflective mirror 11b for reflecting light emitted from the lamps 11a toward the workpieces (downwardly in FIG. 1); and a lamp housing 10a that accommodates these components. The aforementioned first workpiece W1 and second workpiece W2 are each a resin substrate, or alternatively, one of the workpieces is a resin substrate and the other is a glass substrate.

In FIG. 1, the lamp housing 10a includes a plurality of lamps 11a and a plurality of reflective mirrors 11b in a manner such that both the first and second workpieces may be irradiated with vacuum ultraviolet light.

The lamp 11a to be employed is, for example, a vacuum ultraviolet excimer lamp which emits monochromatic light having a center wavelength of 172 nm. Each of the lamps 11a in the light irradiation unit 10 is provided with ON/OFF control by a lamp ON/OFF device 13. That is, the lamp ON/OFF device 13 mainly serves to provide ON/OFF control to the lamps 11a as well as to adjust the value of power supplied to the lamps 11a, thereby adjusting the intensity of the UV light emitted from the lamps 11a.

Note that the light irradiation unit 10 is constructed so as to be actuated by a light irradiation unit actuator 17 in the right and left direction of FIG. 1. Here, the operation of the light irradiation unit actuator 17 is controlled by a light irradiation unit actuator controller 17a.

b. Inverting Stage Unit

The inverting stage unit 30 serves to cooperate with the pressurizing stage unit 20 in order to stack the first workpiece W1 placed on an inverting stage 31 on top of the second workpiece W2 placed on a workpiece stage 21 of the pressurizing stage unit 20.

Figure 2:
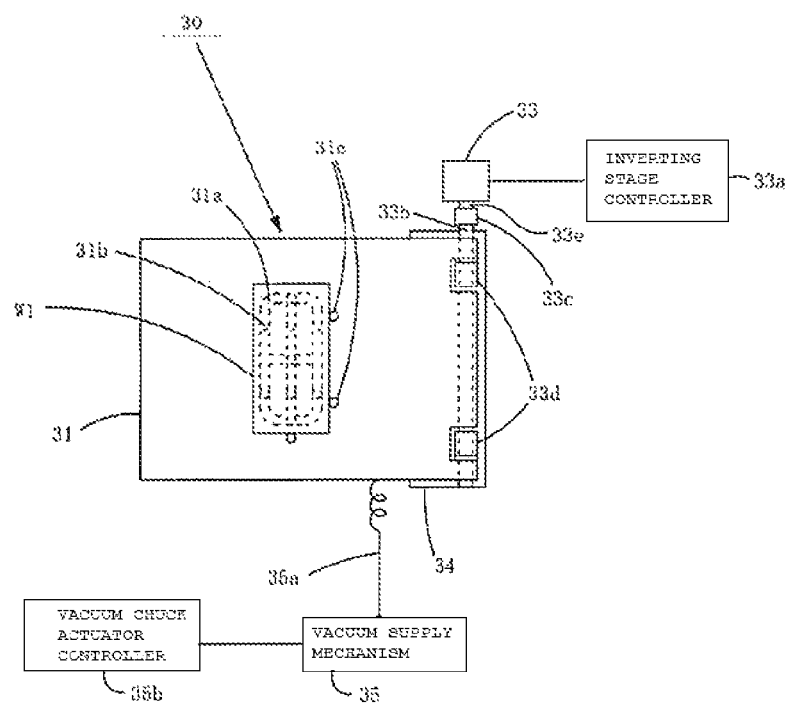
FIG. 2 is a view illustrating an inverting stage unit when viewed in the direction of an arrow A of FIG. 1.

FIG. 2 is a view showing the inverting stage unit when viewed in the direction of arrow A of FIG. 1.

The inverting stage 31 is provided with positioning pins 31c for positioning the first workpiece W1. For a quadrangular workpiece like the first workpiece W1, there are provided three positioning pins 31c, one of the pins corresponding to a shorter side of the quadrangular workpiece and the remaining two pins corresponding to the longer sides of the quadrangular workpiece.

The inverting stage 31 is capable of retainably attracting the first workpiece W1 by a vacuum chuck mechanism.

That is, there is formed a vacuuming groove 31a on a workpiece placement surface of the inverting stage 31 so as to correspond to the shape of the workpiece (the first workpiece W1).

Inside the inverting stage 31 is provided a vacuum supply path (not illustrated). One end of the vacuum supply path is connected to a vacuum supply pipe 35a, while the other end of the vacuum supply path communicates with vacuum supply holes 31b provided in the vacuuming groove 31a.

Placing the first workpiece W1 on the inverting stage 31 will allow a vacuum supply mechanism 35 to supply vacuum through the vacuum supply pipe 35a into the space that is defined by the vacuum supply path, the vacuuming groove 31a, and the placement surface of the first workpiece W1 (i.e., the aforementioned space is reduced in pressure). This causes the first workpiece W1 to be retainably attracted onto the inverting stage 31. To provide control to such a vacuum chuck mechanism, the operation of the vacuum supply mechanism 35 is controlled by a vacuum chuck actuator controller 35b.

There is provided a shaft 33b that penetrates one end side of the inverting stage 31. The shaft 33b and the inverting stage 31 are secured, for example, by a setscrew. As shown in FIGS. 1 and 2, the shaft is rotatably held by a bearing 33d provided on an inverting stage base 34.

One end of the shaft 33b is coupled via a coupling 33c to a rotating shaft 33e of an inverting stage actuator mechanism 33 such as a motor. The operation of the inverting stage actuator mechanism 33 is controlled by an inverting stage controller 33a. For example, when the inverting stage controller 33a commands the rotating shaft 33e of the inverting stage actuator mechanism 33 to rotate 180 degrees in a clockwise direction (in FIG. 1), the shaft 33b coupled thereto via the coupling 33c is also turned 180 degrees. Consequently, the inverting stage 31 secured to the shaft is inverted 180 degrees.

In FIG. 1, the inverting stage 31 is held generally horizontally by means of a stage retainer mechanism 32 provided on the inverting stage 31 and the bearing 33d that rotatably holds the shaft 33b secured to the inverting stage 31.

The stage retainer mechanism 32 holds the inverting stage 31 via a spring on the rear surface of the inverting stage 31. The spring properties such as a spring constant are set so that the inverting stage 31 is held generally horizontally.

When the bonding apparatus shown in FIG. 1 is installed in the atmosphere, the UV light of a wavelength of 172 nm with which the first workpiece W1 and the second workpiece W2 are irradiated from the light irradiation unit 10 will be considerably attenuated in the atmosphere. Therefore, in the atmosphere, the light irradiation unit 10 has to be located close to the surface of the first workpiece W1 and the surface of the second workpiece W2 to some extent.

The inverting stage base 34 can be adjusted in height by inserting a height adjustment spacer 34a. A change in the height of the inverting stage base 34 would cause a change in the height of the bearing 33d provided on the upper surface of the inverting stage base 34. As a result, the inverting stage 31 is tilted.

However, at the time of adjusting the height of the inverting stage base 34, the inverting stage 31 can also be held generally horizontally by adjusting the height of the stage retainer mechanism 32 even when the height of the inverting stage base 34 is changed.

Note that a description will be made later to an inverting stage retainer mechanism 36, a retainer mechanism actuator 36a, and a retainer mechanism actuator controller 36b.

c. Pressurizing Stage Unit

The pressurizing stage unit 20 serves to cooperate with the inverting stage unit 30 in order to stack the first workpiece W1 placed on the inverting stage 31 on top of the second workpiece W2 placed on the workpiece stage 21 of the pressurizing stage unit 20.

Furthermore, the pressurizing stage unit 20 also serves to pressurize the first workpiece W1 and the second workpiece W2 stacked in layers so as to join both the workpieces together.

The pressurizing stage unit 20 is made up of a pressurizing stage 23, an auxiliary stage 22, and the workpiece stage 21 disposed on the auxiliary stage 22. On the upper surface of the pressurizing stage 23 are provided a spring 27 and a spring case 27a for accommodating the spring therein. The spring 27 holds the auxiliary stage 22.

Furthermore, there are two cylindrical pillars 26 that penetrate through the pressurizing stage 23 and the auxiliary stage 22. The pillars 26 penetrate through a bearing structure on each of the stages 23 and 22, allowing each of the stages 23 and 22 to be movable in a linear direction (i.e., in the vertical direction) that is restricted by the pillars 26.

The pillars 26 are provided at the top thereof with a flange 26a. Furthermore, on the pillars 26 there is interposed a height adjustment collar 26b between the flange 26a and the auxiliary stage 22.

As will be described in more detail later, adjusting the thickness of the height adjustment collar 26b will make it possible to adjust the height of the workpiece stage 21 from the base 41 (the distance between the surface of the second workpiece W2 on the workpiece stage 21 and the light irradiation unit 10).

The lower surface of the pressurizing stage 23 is connected to a stage translation mechanism 24 which is made up of, for example, an air cylinder. Actuating the stage translation mechanism 24 will vertically move the pressurizing stage 23, the auxiliary stage 22, and the workpiece stage 21 disposed on the auxiliary stage 22. The stage translation mechanism 24 is controllably actuated by a stage translation mechanism actuator controller 24a.

The second workpiece W2 is placed on the workpiece stage 21. Although not illustrated, on the workpiece stage 21 is provided a positioning mechanism (not shown) for positioning the second workpiece W2. The positioning mechanism to be employed is, for example, a positioning pin as in the case of the inverting stage.

Note that as required, the workpiece stage 21 is configured to be movable in an X and Y directions which are perpendicular to the vertical direction of FIG. 1 and which are orthogonal to each other. Furthermore, in some cases, the workpiece stage is configured to be rotatable and tiltable about the center axis (which is oriented in the same direction as the vertical direction of FIG. 1).

This workpiece stage 21 is controllably actuated by a work stage actuator controller 21a.

Figure 3:
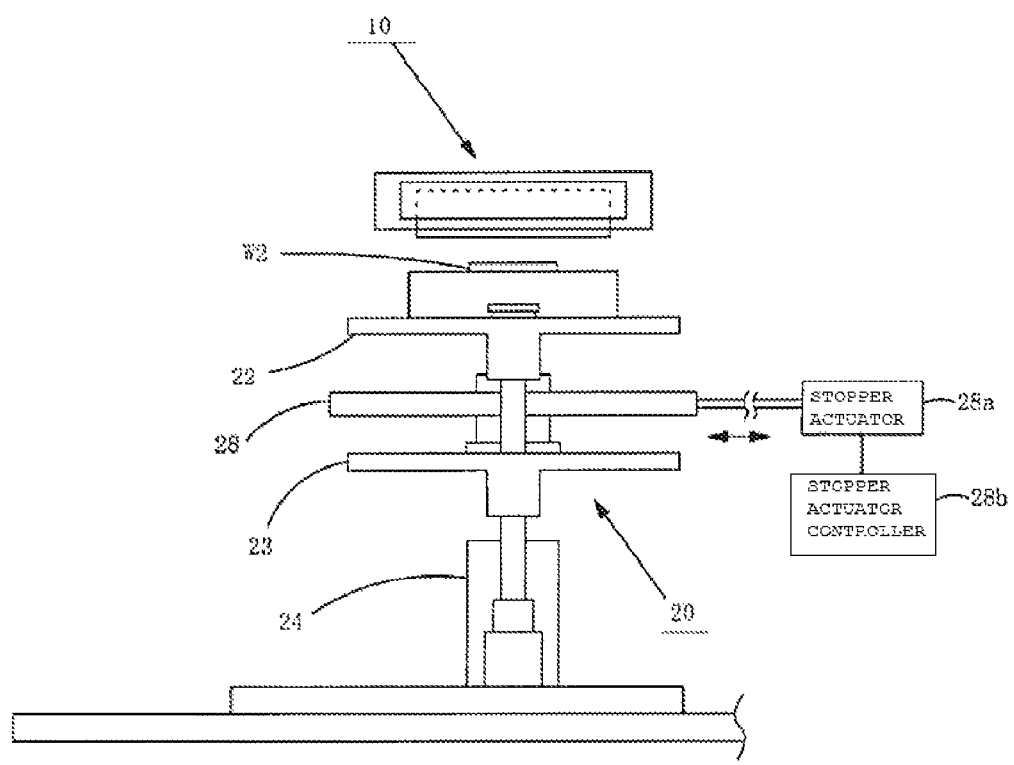
FIG. 3 is a view illustrating a pressurizing stage unit when viewed in the direction of an arrow B of FIG. 1.

FIG. 3 is a view illustrating the pressurizing stage unit when viewed in the direction of arrow B of FIG. 1.

The pressurizing stage unit 20 has a stopper 28 which can be inserted into and detached from a space between the pressurizing stage 23 and the auxiliary stage 22. The stopper 28 is inserted into the space between the pressurizing stage 23 and the auxiliary stage 22 when both the workpieces are pressurized. Note that the operation of the stopper will be described in more detail later.

B. Workpiece Transfer Mechanism and C. Workpiece Heating Mechanism

Figure 4:
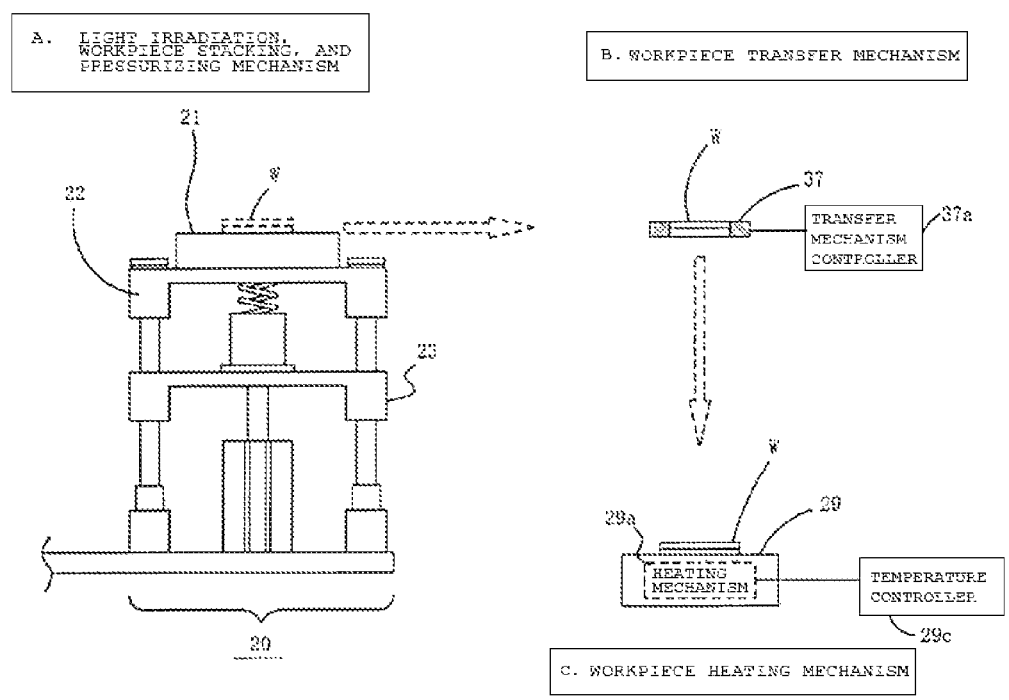
FIG. 4 is a view illustrating an example of a workpiece transfer mechanism and a workpiece heating mechanism.

FIG. 4 shows an example of a workpiece transfer mechanism and a workpiece heating mechanism. In the figure, (A) shows the light irradiation, workpiece stacking, and pressurizing mechanism described in relation to FIGS. 1 to 3, (B) shows the workpiece transfer mechanism, and (C) shows the workpiece heating mechanism.

The workpiece transfer mechanism transfers, to the workpiece heating mechanism, two workpieces which have been subjected, by the light irradiation, workpiece stacking, and pressurizing mechanism, to the aforementioned processes, [Step 1], [Step 2], and [Step 3] so as to be "temporarily joined together." The temporarily joined workpieces W placed on the workpiece stage 21 of the pressurizing stage unit 20 in the light irradiation, workpiece stacking, and pressurizing mechanism are transferred by a transfer mechanism 37 of the workpiece transfer mechanism from the workpiece stage 21 to a heating stage 29 of the workpiece heating mechanism. Here, the transfer mechanism 37 is controllably actuated by a transfer mechanism controller 37a.

The heating stage 29 of the workpiece heating mechanism heats the temporarily joined workpieces W to a predetermined temperature of the workpieces; holds the temperature for a predetermined time; and then lowers the temperature.

As described above, the predetermined temperature is a temperature at the level of which the workpieces W are not distorted. Furthermore, the predetermined time refers to the time in which the workpieces W are started to be heated until the workpieces W are completely joined together. Note that as described above, "being completely joined together" means that insufficiently joined regions present on the joined surfaces after the end of [Step 3] are sufficiently joined together.

The heating stage 29 includes a heating mechanism 29a which is formed, for example, by burying a sheath heater inside the stage. The temperature of the heating stage 29 is controlled by a temperature controller 29c. On the basis of information on the temperature of the surface of the heating stage 29 measured by a temperature sensor (not illustrated), the temperature controller 29c controls the heating mechanism 29a so that the temperature of the surface of the heating stage 29 becomes a predetermined temperature. Note that the correlation data between the temperature of the surface of the heating stage 29 and the heating property and the endpoint temperature of the workpieces are pre-stored in a table of the temperature controller 29c.

Now, referring to FIGS. 1 through 4 and FIGS. 5 through 10, a description will be made to an example of the operation of the bonding apparatus for carrying out the method for bonding workpieces together according to the present invention. By way of example, the workpieces to be employed are microchip substrates.

A. [Preparation] Operation 1 (Before Irradiation with Light)

(1) By taking the thickness of the first workpiece W1 into account, the inverting stage unit 30 is adjusted by means of the height adjustment spacer 34a so that the height of the inverting stage base 34 is at a predetermined height. The predetermined height refers to a height at which the distance between the lower side of the lamps 11a and the surface of the first workpiece W1 to be irradiated is "D" (see FIG. 5) when the first workpiece W1 is placed on the inverting stage 31 and the light irradiation unit 10 is positioned by the light irradiation unit actuator 17 so that the first workpiece W1 and the second workpiece W2 are positioned in the regions to be irradiated by the light irradiation unit 10. That is, the height adjustment spacer 34a functions as a gap setting mechanism for setting the distance between the light irradiation unit 10 and the surface of the first workpiece W1 placed on the inverting stage 31.

(2) The first workpiece W1 is placed on the inverting stage 31 of the inverting stage unit 30 and then positioned in place. Here, the first workpiece W1 is to assume a quadrangular shape. The first workpiece W1 is positioned by being pushed against the positioning pins 31c as shown in FIG. 2. Note that the first workpiece W1 may be placed by an operator or alternatively, using a known transfer mechanism (not illustrated nor explained).

(3) The vacuum chuck actuator controller 35b actuates the vacuum supply mechanism 35 so as to supply vacuum to the inverting stage 31 through the vacuum supply pipe 35a. That is, the space defined by a vacuum supply path (not illustrated), the vacuuming groove 31a, and the placement surface of the first workpiece W1 is reduced in pressure, allowing the first workpiece W1 to be retainably attracted to the inverting stage 31.

(4) On the other hand, in the pressurizing stage unit 20, the second workpiece W2 is placed on the workpiece stage 21 so as to be positioned in place. The positioning is carried out in the same manner, for example, as in the case of the first workpiece W1, and will not be detailed here. Note that the second workpiece W2 may be placed by an operator or alternatively, using a known transfer mechanism (not illustrated nor explained).

(5) By taking the thickness of the second workpiece W2 into account, the stage translation mechanism actuator controller 24a actuates the stage translation mechanism 24 to thereby move the pressurizing stage 23, the auxiliary stage 22, and the workpiece stage 21, thus adjusting the height of the workpiece stage 21 to a predetermined height. More specifically, the stage translation mechanism 24 is actuated by the stage translation mechanism actuator controller 24a, and the pressurizing stage 23, the auxiliary stage 22, and the workpiece stage 21 are moved until the surface of the auxiliary stage 22 is brought into contact with the height adjustment collar 26b as well as the height adjustment collar 26b is brought into contact with the flange 26a of the pillar 26.

The height of the surface of the auxiliary stage 22 depends on the thickness of the height adjustment collar 26b provided between the auxiliary stage 22 and the flange 26a. That is, the height of the workpiece stage 21 provided on the surface of the auxiliary stage 22 also depends on the thickness of the height adjustment collar 26b, and the thickness of the height adjustment collar 26b is selected so that the height of the workpiece stage 21 becomes the predetermined height mentioned above. That is, the height adjustment collar 26b serves as the gap setting mechanism for setting the distance between the light irradiation unit 10 and the surface of the second workpiece W2 placed on the workpiece stage 21.

Here, the predetermined height refers to the height at which the distance between the lower side of the lamps 11a and the surface of the second workpiece W2 to be irradiated becomes D as will be discussed later when the second workpiece W2 is placed on the workpiece stage 21 and the light irradiation unit 10 is positioned by the light irradiation unit actuator 17 (see FIG. 1) so that the first workpiece W1 and the second workpiece W2 are positioned in the regions to be irradiated by the light irradiation unit 10.

That is, the height of the surface to be irradiated of the first workpiece W1 from the base 41 is generally flush with the height of the surface to be irradiated of the second workpiece W2 from the base 41.

(6) The temperature controller 29c (see FIG. 4) controls the temperature of the heating stage 29 in advance. That is, on the basis of information on the temperature of the surface of the heating stage 29 measured by a temperature sensor (not illustrated), the temperature controller 29c controls the heating mechanism 29a so that the temperature of the surface of the heating stage 29 becomes a predetermined temperature. As described above, the correlation data between the temperature of the surface of the heating stage 29 and the heating property and the endpoint temperature of the workpieces are pre-stored in a table of the temperature controller 29c. The temperature controller 29c allows the temperature of the heating stage 29 to be increased and then held at a constant temperature on the basis of the stored table so that the temperature of the workpieces reaches a predetermined temperature (at the level of which the workpieces are not distorted) when the workpieces are placed on the heating stage 29.

The reason that the heating stage 29 is pre-heated is to quickly move from [Step 3] onto [Step 4].

In Steps (1) through (6), the first workpiece W1 is positioned on the inverting stage 31; the second workpiece W2 is positioned on the workpiece stage 21; the height of the surface of the first workpiece W1 and the height of the surface of the second workpiece W2 are adjusted; and the heating stage 29 is pre-heated.

B. [Step 1] Operation 2 (Light Irradiation)

(7) The light irradiation unit actuator 17 actuates the light irradiation unit 10 so as to allow the first workpiece W1 held by the inverting stage unit 30 and the second workpiece W2 held by the pressurizing stage unit 20 to be located in the regions to be irradiated by the light irradiation unit 10. FIG. 1 shows the workpieces W1 and W2 positioned in the regions to be irradiated by the light irradiation unit 10. That is, the lamps 11a of the light irradiation unit 10 are positioned above the workpiece W1 and the workpiece W2.

Note that as described above, the surface to be irradiated of the first workpiece W1 and the surface to be irradiated of the second workpiece W2 are generally flush with each other. On the other hand, let D be the distance between the lower side of the lamps 11a and the surface to be irradiated of the first workpiece W1 as well as the distance between the lower side of the lamps 11a and the surface to be irradiated of the second workpiece W2. The distance D is set, for example, to 1 through 5 mm because the UV light of a wavelength of 172 nm emitted from the lamps are considerably attenuated in the atmosphere. As described above, in this embodiment, the distance D is set by the height adjustment spacer 34a or the height adjustment collar 26b which serves as the gap setting mechanism.

(8) The lamps 11a are turned ON by the lamp ON/OFF device 13 (see FIG. 1), so that the first workpiece W1 as well as the second workpiece W2 are irradiated with UV light at a wavelength of 172 nm. Note that the lamp ON/OFF device 13 controls power supplied to the lamps 11a so that the irradiance on the surface of the first workpiece W1 and on the surface of the second workpiece W2 takes on a predetermined value.

(9) After a predetermined irradiation time has elapsed, the lamp ON/OFF device 13 turns OFF the lamps 11a. Here, it is assumed that the lamp ON/OFF device 13 can also set the time at which the lamps are turned ON.

In Steps (7) through (9) mentioned above, the first workpiece W1 and the second workpiece W2 are placed in the regions to be irradiated, and both the workpieces are irradiated with light for a predetermined time.

Note that in Steps (7) through (9), the first workpiece W1 and the second workpiece W2 are irradiated with light at the same time; however, it is not always necessary to perform the light irradiation at the same time. For example, the first workpiece W1 may be first irradiated with UV light, and the second workpiece W2 may be then irradiated with UV light. Alternatively, the second workpiece W2 may be first irradiated with UV light and the first workpiece W1 may be then irradiated with UV light.

However, since the activated state of the light-irradiated surface lasts only for a certain period of time, the first workpiece W1 and the second workpiece W2 are desirably irradiated with light at the same time if both the workpieces are irradiated with light.

When the first workpiece W1 and the second workpiece W2 are individually irradiated with UV light as described above, the light irradiation unit 10 is constructed so as to be drivable in the right and left direction by the light irradiation unit actuator 17, and the first workpiece W1 and the second workpiece W2 are individually irradiated with UV light emitted from the light irradiation unit 10. Such a structure makes the light irradiation unit 10 compact.

It is also possible to irradiate only one of the two workpieces W1 and W2 with UV light and then bond the workpieces together.

Figure 5:
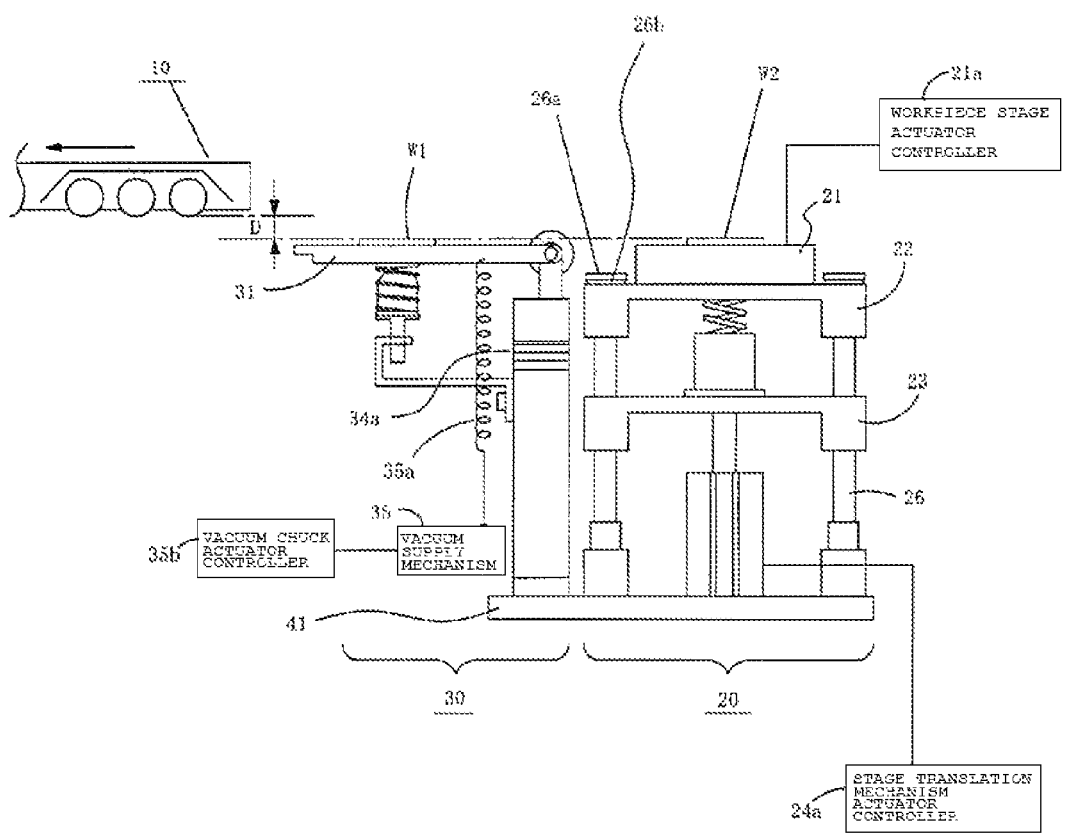
FIG. 5 is an explanatory view (1) illustrating an operation (a retreat of a light irradiation unit) according to an embodiment of the present invention.

C. [Step 2] Operation 3 (Retreat of Light Irradiation Unit)
(10) As shown in FIG. 5, the light irradiation unit 10 is actuated by the light irradiation unit actuator 17 (see FIG. 1) so as to be positioned at a retreat position. The retreat position is a position at which the inverting stage 31 does not interfere with the light irradiation unit 10 when the inverting stage 31 is inverted.

In Step of (10), the light irradiation unit 10 is retreated from above the inverting stage.

Figure 6:
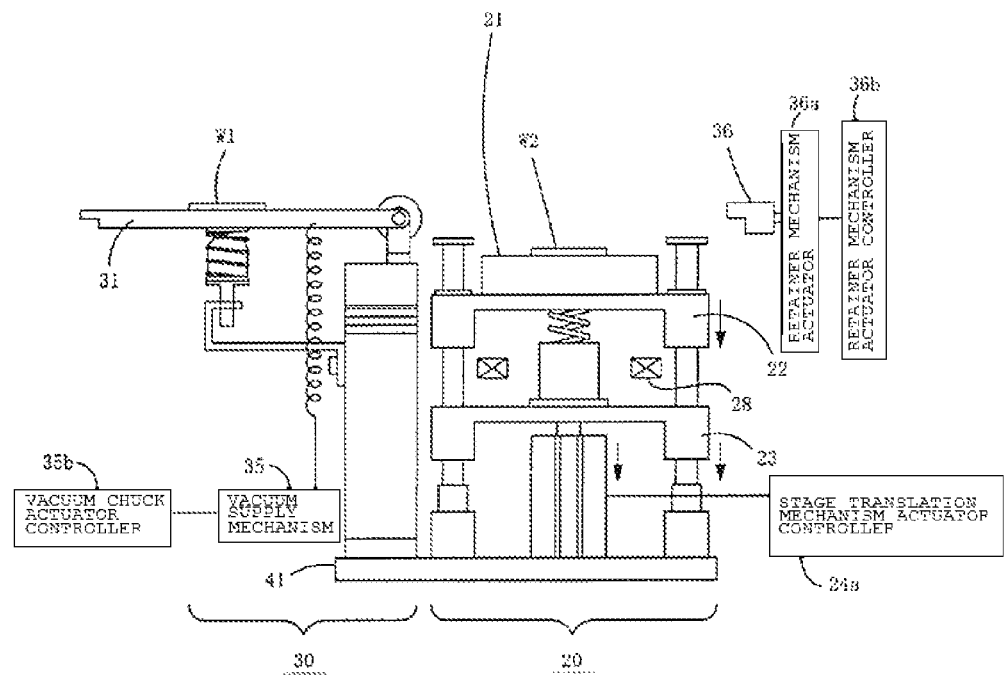
FIG. 6 is an explanatory view (2) illustrating an operation (preparation for an inverting and pressurizing operation) according to an embodiment of the present invention.

D. [Step 2] Operation 4 (Inverting Operation and Preparation for Pressurizing Operation)
(11) As shown in FIG. 6, the stage translation mechanism actuator controller 24a actuates the stage translation mechanism 24 so as to move the pressurizing stage 23, the auxiliary stage 22, and the workpiece stage 21 downwardly, thereby adjusting the height of the workpiece stage 21 to a predetermined height. The predetermined height refers to a height at which when the inverting stage 31 is inverted, the first workpiece W1 retainably attracted on the inverting stage 31 does not collide with the second workpiece W2 on the workpiece stage 21. That is, when the inverting stage 31 is inverted, the first workpiece W1 and the second workpiece W2 are held with a predetermined gap therebetween.

(12) The stopper 28 is inserted into the space between the pressurizing stage 23 and the auxiliary stage 22. The stopper 28 is actuated by a stopper actuator 28a (see FIG. 3) and controlled by a stopper actuator controller 28b.

In Steps (11) through (12), the first workpiece W1 retainably attracted on the inverting stage 31 is configured not to collide with the second workpiece W2 on the workpiece stage 21 upon inversion of the inverting stage 31, thereby making the inverting stage 31 ready to be inverted. The workpieces are now ready for the subsequent pressurizing step.

Figure 7:
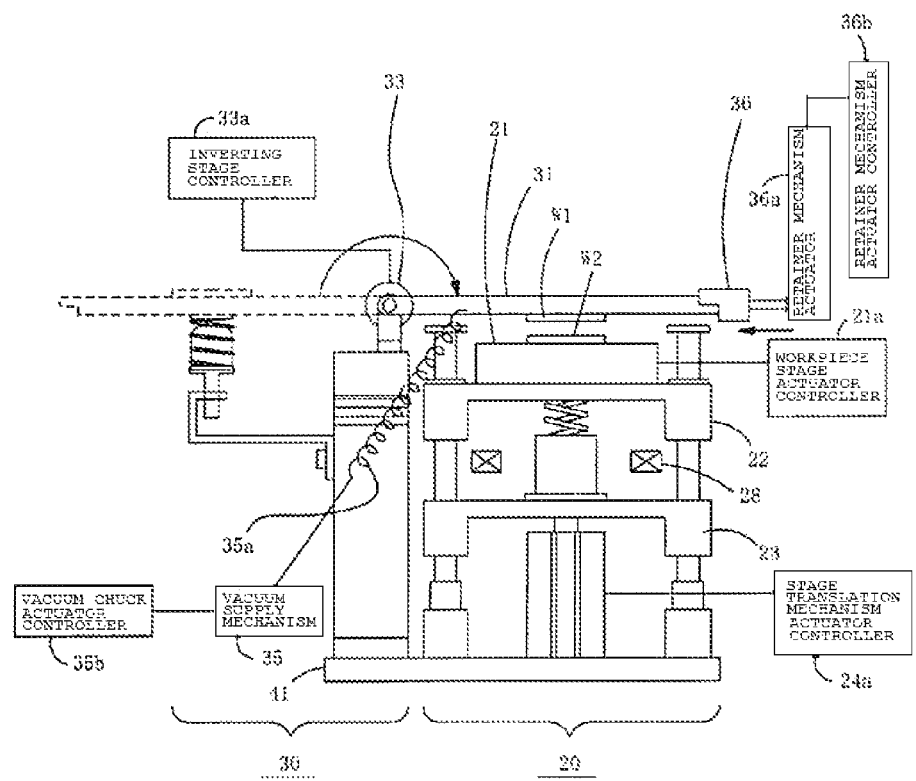
FIG. 7 is an explanatory view illustrating (3) an operation (inverting operation) according to an embodiment of the present invention.

E. [Step 2] Operation 5 (Inverting Operation)
(13) As shown in FIG. 7, in the inverting stage unit 30, the inverting stage 31 on which the first workpiece W1 is retainably attracted is inverted, so that the first workpiece W1 is opposed to the second workpiece W2.

More specifically, the inverting stage controller 33a shown in FIG. 2 actuates the inverting stage actuator mechanism 33, allowing the rotating shaft 33e of the inverting stage actuator mechanism 33 to rotate 180 degrees. Here, since the shaft 33b to which the inverting stage 31 is secured is coupled via the coupling 33c to the rotating shaft 33e, the rotation of the rotating shaft 33e will cause the shaft 33b to be rotated. As a result, the inverting stage 31 secured to the shaft 33b is inverted 180 degrees.

(14) After the inverting stage 31 is inverted, an inverting stage retainer mechanism 36 is actuated so as to retain the inverting stage 31. In FIG. 7, the inverting stage retainer mechanism 36 restricts the counterclockwise inversion of the inverting stage 31. Note that the clockwise rotation of the inverting stage 31 is restricted by a stopper (not illustrated).

The inverting stage retainer mechanism 36 is actuated by the retainer mechanism actuator 36a. Note that the retainer mechanism actuator 36a is controlled by the retainer mechanism actuator controller 36b. Here, since the inverting stage retainer mechanism 36 is actuated after the inversion of the inverting stage 31, the mechanism 36 is retreated, before the inversion of the inverting stage 31, to a position at which the mechanism 36 will not interfere with the inverting stage 31 being inverted.

(15) The first workpiece W1 on the inverting stage 31 and the second workpiece W2 on the workpiece stage 21 are positioned so as to be located in a predetermined positional relation after the inversion of the inverting stage 31. Here, the predetermined positional relation refers to a relation in which the first workpiece W1 is superimposed on the second workpiece W2 in a desired positional relation when the first workpiece W1 is staked on the second workpiece W2 in the subsequent step.

Here, when the first workpiece W1 and the second workpiece W2 have to be aligned with accuracy, the workpiece W1 and the workpiece W2 are provided in advance with an alignment mark, so that the alignment mark of the first workpiece W1 and the alignment mark of the second workpiece W2 are detected by an alignment mark detection mechanism (not illustrated). Then, on the basis of the detection result, the workpiece stage actuator controller 21a actuates the workpiece stage 21 so that the positions of both the alignment marks coincide with each other.

In Steps (13) through (15), the inverting stage 31 is inverted, and the inverting stage 31 is retained at an inverted position. Note that in some cases, the first workpiece W1 and the second workpiece W2 may be aligned with each other.

F. [Step 2] and [Step 3] Operation 6 (Pressurizing Operation)

Figure 8:
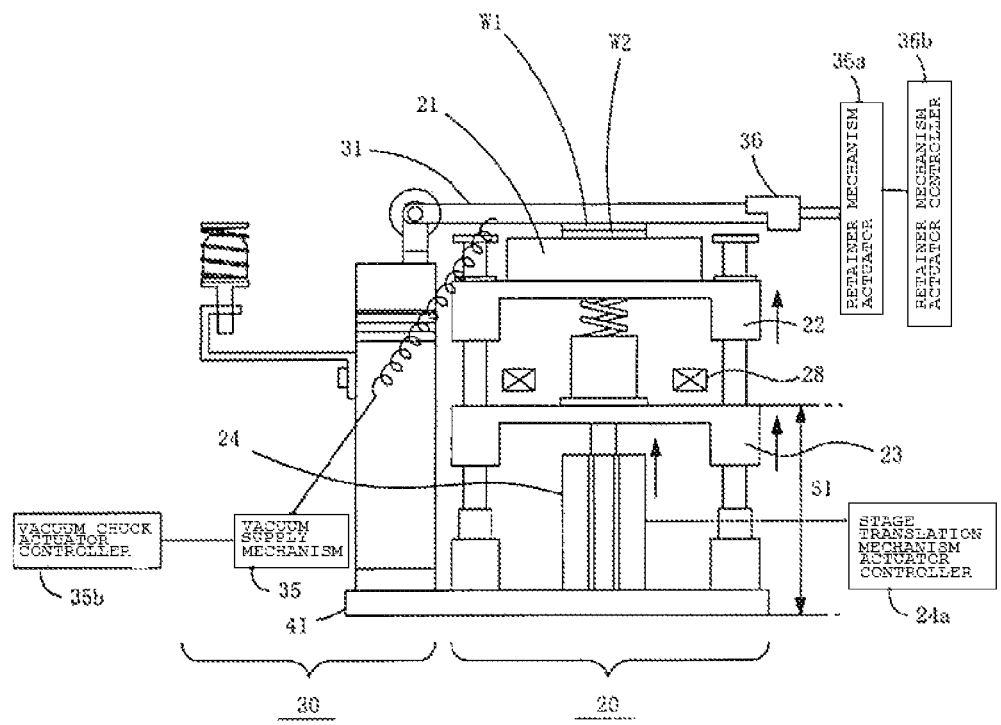
FIG. 8 is an explanatory view (4) illustrating an operation (pressurizing operation) according to an embodiment of the present invention.

(16) As shown in FIG. 8, in the pressurizing stage unit 20, the stage translation mechanism actuator controller 24a actuates the stage translation mechanism 24 so as to move upwardly the pressurizing stage 23, the auxiliary stage 22, and the workpiece stage 21, thereby allowing the second workpiece W2 placed on the workpiece stage 21 to be brought into contact with the first workpiece W1 retainably attracted on the inverting stage 31. At this time, the distance between the upper surface of the base 41 and the surface of the pressurizing stage 23 is S1.

Figure 9:
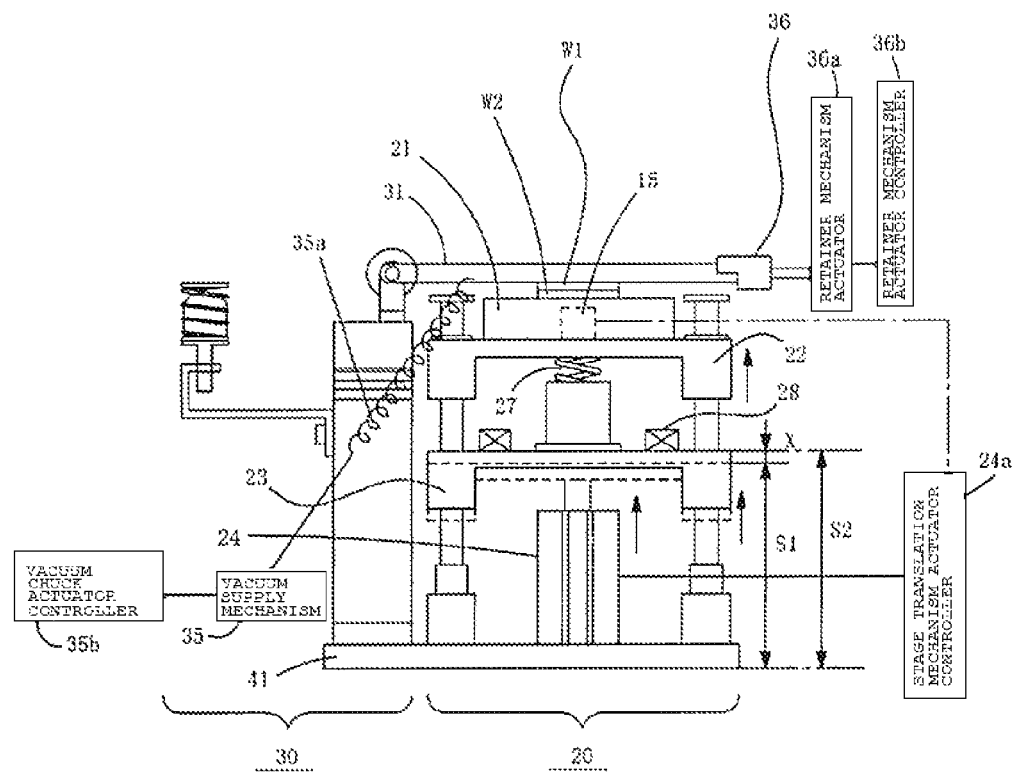
FIG. 9 is an explanatory view (5) illustrating an operation (pressurizing operation) according to an embodiment of the present invention.

(17) As shown in FIG. 9, in the pressurizing stage unit 20, the stage translation mechanism actuator controller 24a continues to actuate the stage translation mechanism 24 even after the first workpiece W1 and the second workpiece W2 are brought into contact with each other (after the first workpiece W1 is stacked on the second workpiece W2.) Then, the actuation of the stage translation mechanism 24 is stopped when the upper surface of the pressurizing stage 23 comes into contact with the stopper 28.

As described above, the counterclockwise inversion of the inverting stage 31 retainably attracting the first workpiece W1 is restricted by the inverting stage retainer mechanism 36. Thus, the auxiliary stage 22 on which the workpiece stage 21 with the second workpiece W2 placed thereon is mounted cannot move upwardly. Therefore, the spring 27 inserted in between the pressurizing stage 23 and the auxiliary stage 22 is compressed by the upward displacement (x) of the pressurizing stage 23 from the position at which the first workpiece W1 is brought into contact with the second workpiece W2 to the position at which the upper surface of the pressurizing stage 23 is brought into contact with the stopper 28.

That is, in this embodiment, the inverting stage retainer mechanism 36 is equivalent to the movement restricting mechanism that restricts the upward movement of the first workpiece W1 and the second workpiece W2 stacked in layers.

That is, letting S2 be the distance between the upper surface of the base 41 and the surface of the pressurizing stage 23 when the surface of the pressurizing stage 23 comes into contact with the stopper 28, the aforementioned displacement x is defined such that x=S2−S1. Therefore, letting k be the spring constant of the spring 27, the first workpiece W1 and the second workpiece W2 are subjected to the pressure of a magnitude of P=|kx|.

That is, the pressure to be applied to the first workpiece W1 and the second workpiece W2 is adjusted to a predetermined value by adjusting the spring constant of the spring 27 and the position into which the stopper 28 is inserted.

Note that the aforementioned pressure is measured by a pressure sensor 15 (see FIG. 9) provided in the workpiece stage 21. The pressure information detected by the pressure sensor 15 is sent, for example, to the stage translation mechanism actuator controller 24a, or alternatively, for example, to pressure display means (not illustrated).

Note that the pressure being applied to the first workpiece W1 and the second workpiece W2 can also be changed in the pressure value while the pressure is being applied. For example, when a plurality of first workpieces W1 and second workpieces W2 are bonded together, variations are found in the thickness of the workpieces. The presence of such a variation also leads to a variation in the value of S1 or the distance between the upper surface of the base 41 and the surface of the pressurizing stage 23 when the second workpiece W2 and the first workpiece W1 come into contact with each other. Therefore, the aforementioned displacement x=S2−S1 is also varied, resulting in a variation in the pressure P=|kx| to be applied to the first workpiece W1 and the second workpiece W2.

In this case, the stage translation mechanism is actuated until the upper surface of the pressurizing stage 23 is brought into contact with the stopper 28 so as to apply the pressure of a magnitude of P=|kx| to the first workpiece W1 and the second workpiece W2. Next, with this pressure maintained, a pressure Ps detected by the pressure sensor 15 is checked in order to change the position of the stopper 28 in the vertical direction so that the pressure Ps is equal to a predetermined pressure P. That is, a variation in the distance S1 is corrected by adjusting the value of the distance S2.

More specifically, on the basis of the pressure information from the pressure sensor 15, the stopper actuator 28a actuates the stopper 28 so as to adjust the vertical position of the stopper 28 inserted in the space between the pressurizing stage 23 and the auxiliary stage 22. Note that as described above, the stopper actuator 28a is controlled by the stopper actuator controller 28b. The stopper actuator controller 28b actuates the stopper actuator 28a on the basis of the pressure information from the pressure sensor 15 so that the detected pressure Ps is equal to the predetermined pressure P. Note that when the pressure information is displayed on the pressure display means (not illustrated), the operator operates the stopper actuator controller 28b while viewing the displayed information.

That is, by adjusting the vertical position of the stopper 28, the value of the distance S2 is adjusted so that the aforementioned displacement becomes x, thus adjusting the magnitude of the pressure P=|kx| to be applied to the first workpiece W1 and the second workpiece W2.

In Steps (16) through (18), the first workpiece W1 and the second workpiece W2 are stacked in layers ([Step 2]), and pressure is applied thereto ([Step 3]).

Note that in this embodiment, the stopper 28 and the stopper actuator 28a are equivalent to the mechanism that adjusts the contact pressure between the first workpiece W1 and the second workpiece W2 stacked in layers.

G. [Step 3] Operation 7 (Releasing of Pressure being Applied to Workpieces (Microchip))

(19) In the inverting stage unit 30 after a predetermined time has elapsed from the start of applying pressure to the first workpiece W1 and the second workpiece W2, the vacuum chuck actuator controller 35b stops actuating the vacuum supply mechanism 35, thus stopping supplying vacuum to the inverting stage 31. Then, the inverting stage 31 is supplied with air by a purging mechanism (not illustrated). That is, the pressure of the space defined by the vacuum supply path, the vacuuming groove 31a, and the placement surface of the first workpiece W1 is now turned from the reduced pressure to the atmospheric pressure, thereby releasing the retainable attraction between the inverting stage 31 and the surface of the microchip (the surface of the first workpiece W1 of the microchip).

Note that the predetermined time mentioned above refers to the time from the start of pressurizing the first workpiece W1 and the second workpiece W2 until both the workpieces are joined together ("temporarily joined together") though some regions are found to be sufficiently joined together and the other regions to be insufficiently joined together at the same time on the joined surfaces of the first workpiece W1 and the second workpiece W2.

Figure 10:
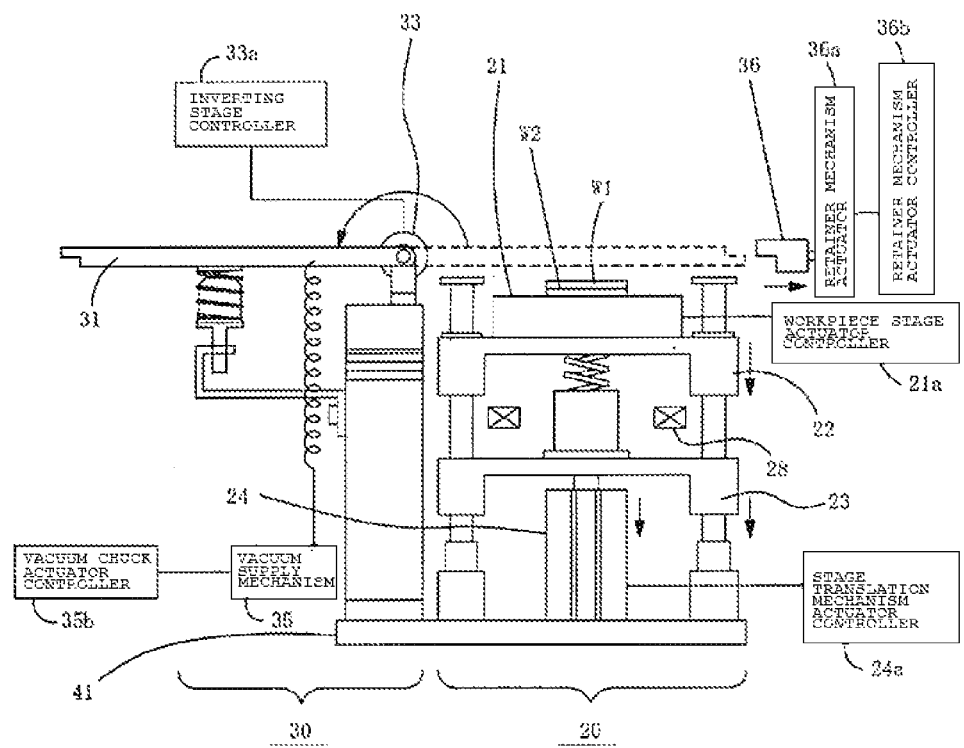
FIG. 10 is an explanatory view (6) illustrating an operation (for taking out workpieces) according to an embodiment of the present invention.

(20) As shown in FIG. 10, in the pressurizing stage unit 20, the stage translation mechanism 24 is actuated by the stage translation mechanism actuator controller 24a, thereby moving downwardly the pressurizing stage 23, the auxiliary stage 22, and the workpiece stage 21. The stages are moved to any position at which the microchip surface is spaced apart from the inverting stage 31 and the application of pressure to the microchip is released.

(21) The retainer mechanism actuator 36a actuates the inverting stage retainer mechanism 36, so that the inverting stage retainer mechanism 36 is retreated to a position at which the inverting operation of the inverting stage 31 is not interfered. This releases the retention of the inverting stage 31.

(22) In the inverting stage unit 30, the inverting stage 31 retainably attracting the first workpiece W1 is inverted in the direction opposite to that in Step (15), allowing the inverting stage 31 to be retreated from above the microchip.

More specifically, the inverting stage actuator mechanism 33 is actuated by the inverting stage controller 33a, so that the rotating shaft 33e of the inverting stage actuator mechanism 33 (see FIG. 2) coupled via the coupling 33c to the shaft 33b to which the inverting stage 31 is secured is rotated −180 degrees as shown in FIG. 10.

In Steps (19) through (22), the first workpiece W1 and the second workpiece W2 stacked in layers are "temporarily joined together" ([Step 3]), and the application of pressure to the workpieces stacked in layers is released ([Step 3]).

H. [Step 4] Operation 8 (Transfer of Workpieces (Microchip))

(23) As shown in FIG. 4, in the pressurizing stage unit 20, the transfer mechanism 37 of the workpiece transfer mechanism grasps the "temporarily joined" workpieces W (microchip) placed on the workpiece stage 21 and retreats and transfers the workpieces W from the workpiece stage 21 to the heating stage 29. Note that the workpieces W may be transferred by an operator from the workpiece stage 21 to the heating stage 29. In this case, the transfer mechanism 37 may be eliminated.

(24) The transfer mechanism 37 places the workpieces transferred to the heating stage 29 onto the heating stage 29.

In Steps (23) through (24), the workpieces W (microchip) are transferred from the workpiece stage 21 to the heating stage 29, and then placed on the heating stage 29.

I. [Step 4] Operation 9 (Heating of Workpieces (Microchip))

(25) The temperature controller 29c starts to control the temperature of the heating stage 29. As described above, since the heating stage 29 is pre-heated, the temperature control of the workpieces W is started from the point in time at which the workpieces W are placed on the heating stage 29.

The temperature controller 29c controls the heating mechanism 29a in a manner such that the temperature of the workpieces reaches a predetermined temperature (at the level of which the workpieces W will not be distorted) from the point in time at which the workpieces W are placed on the heating stage 29, and this temperature is kept for a predetermined time (the time from the start of heating the workpieces until the workpieces are completely joined together) and then decreased. The heating mechanism 29a is controlled on the basis of the table of the correlation data stored in the temperature controller 29c between the temperature of the surface of the heating stage 29 and the heating property of the workpieces W and the endpoint temperature of the workpieces W.

Note that the temperature of the workpieces is lowered by stopping supplying energy to the heating mechanism 29a (e.g., stopping supplying power to a sheath heater buried inside the stage.)

Stopping supplying energy to the heating mechanism 29a will cause the workpieces (microchip) on the heating stage 29 to be cooled down to the room temperature.

Note that to reduce the cooling time, the heating stage 29 may be provided therein with a cooling mechanism (not illustrated). As an example of the cooling mechanism, a cooling pipe may be buried inside the heating stage 29 and a refrigerant is allowed to flow through the cooling pipe. The heating stage 29 is cooled by heat exchange between the refrigerant and the heating stage 29. Note that the cooling mechanism is also controlled, for example, by the temperature controller 29c. The temperature controller 29c operates, for example, the cooling mechanism after power supply to the sheath heater is stopped, and controls the cooling mechanism so that the temperature of the surface of the heating stage 29 becomes the room temperature, on the basis of the temperature information of the surface of the heating stage 29 measured by the temperature sensor (not illustrated).

Each component of the bonding apparatus described above is operated by each controller shown in FIGS. 1 to 4.

That is, the lamp ON/OFF device 13 turns ON/OFF the UV lamps 11a and controls the lamp ON time. The vacuum chuck actuator controller 35b controls the operation of the vacuum supply mechanism 35 for operating the vacuum chuck mechanism.

The inverting stage controller 33a controls the operation of the inverting stage actuator mechanism 33 for inverting the inverting stage 31.

The stage translation mechanism actuator controller 24a controls the operation of the stage translation mechanism 24 for moving the pressurizing stage 23, the auxiliary stage 22, and the workpiece stage 21 in the vertical direction.

The workpiece stage actuator controller 21a controllably actuates, as required, the workpiece stage 21 for aligning the first workpiece W1 and the second workpiece W2.

The stopper actuator controller 28b controls the operation of the stopper actuator 28a for actuating the stopper 28 that contributes to the application of pressure to the microchip.

The retainer mechanism actuator controller 36b controls the operation of the retainer mechanism actuator 36a that actuates the inverting stage retainer mechanism 36 for restricting the counterclockwise inversion of the inverting stage 31 in FIG. 8.

The transfer mechanism controller 37a controls the operation of the transfer mechanism 37 for transferring, to the heating stage 29, the "temporarily joined" workpieces placed on the workpiece stage.

The temperature controller 29c controls the heating mechanism 29a on the basis of the temperature information of the surface of the heating stage 29 measured by the temperature sensor (not illustrated) so that the temperature of the surface of the heating stage 29 becomes a predetermined temperature. Furthermore, as required, the temperature controller 29c controls a cooling mechanism 29b (not illustrated) on the basis of the aforementioned temperature information so that the temperature of the surface of the heating stage 29 becomes a predetermined temperature.

These controllers provide control on an as-needed basis in each of [Step 1] to [Step 4] mentioned above.

The joining process according to the present invention described above has not yet been clearly investigated; however, the workpieces are thought to be joined together in the following manner.

[Step 1]

Typically, the workpiece surfaces to be joined together are irradiated with vacuum ultraviolet light in the atmosphere. Irradiating the workpiece surfaces to be joined together with vacuum ultraviolet light at a wavelength of 200 nm or less causes active oxygen to be produced, so that the active oxygen oxidizes the surfaces to be joined together. For example, if the workpieces are made of a resin, the oxidizing power of the active oxygen may cut the intermolecular coupling of the resin or volatilize the resin on the substrate surfaces, causing, e.g., an organic substance adhered to the workpiece surfaces to be decomposed or removed. That is, the workpiece surfaces are cleaned and the main polymer chain of the resin surfaces is cut so as to produce radicals.

It is also thought that irradiating the workpiece (resin) surfaces with vacuum ultraviolet light will cause radicals to generate all over the light-irradiated surfaces by producing a highly reactive functional group such as a hydroxyl group (—OH), a carboxyl group (—COOH), or an aldehyde group (—CHO) on the light-irradiated surfaces, by substituting the workpiece surfaces by these functional groups, or by directly cutting the main polymer chain of the resin surfaces when irradiated with the vacuum ultraviolet light.

That is, the activation of the surfaces of the workpieces to be joined together by being irradiated with vacuum ultraviolet light is thought to let the surfaces to be joined together have the tendency to cause a chemical reaction to occur on their own, for example, in the case of the resin workpieces, by generating radicals on the workpiece surfaces or producing, e.g., a highly reactive functional group accompanied by bonding damage to the resin itself.

[Step 2]

It is thought that after the surfaces to be joined together which have been activated in [Step 1] are opposed to and aligned with each other, the surfaces to be joined together are brought into contact with each other and stacked one on the other, thereby causing a chemical reaction to occur on the surfaces being joined together. For example, it is thought that the radicals present on each of the joined surfaces are bonded together or some bonding reactions via the aforementioned functional groups proceed. That is, it is thought that such a chemical reaction proceeds so as to join the workpieces together. Note that in the case where one workpiece is a glass substrate and the other is a resin substrate, it is thought that for example, a chemical reaction via OH radicals or a bonding reaction via active oxygen proceeds so as to join the workpieces together.

[Step 3]

It is thought that the pair of workpieces stacked in layers are pressurized and kept pressurized for a predetermined time, thereby accelerating the chemical reaction (for joining the workpieces together) that has started in [Step 2]. Note that due to the shape of the light-irradiated surface of a workpiece (e.g., when the workpiece is a microchip substrate, part of the light-irradiated surface has a groove structure that forms a flow path), there is a possibility that the surfaces being joined together may not always be uniformly pressurized, and thus the aforementioned chemical reaction is not always uniformly accelerated. It is therefore thought that in some cases, some regions are sufficiently joined together and the other regions are insufficiently joined together at the same time on the joined surfaces.

[Step 4]

It is thought that the pressure on the workpieces is released after the application for the predetermined time mentioned above; the workpieces having been "temporarily joined together" are heated to a predetermined workpiece temperature; and the workpieces are held at this temperature until the workpieces are completely joined together, thereby allowing, e.g., radicals and highly reactive functional groups on the activated surfaces of each workpiece to be diffused. It is therefore thought that the diffused radicals and highly reactive functional groups also accelerate chemical reactions in the insufficiently joined regions present on the joined surfaces after the end of [Step 3], with the result that even such regions are provided with an enhanced bonding strength, allowing the regions to be sufficiently joined together.

[Modified Example of the Bonding Apparatus]

Figure 11:
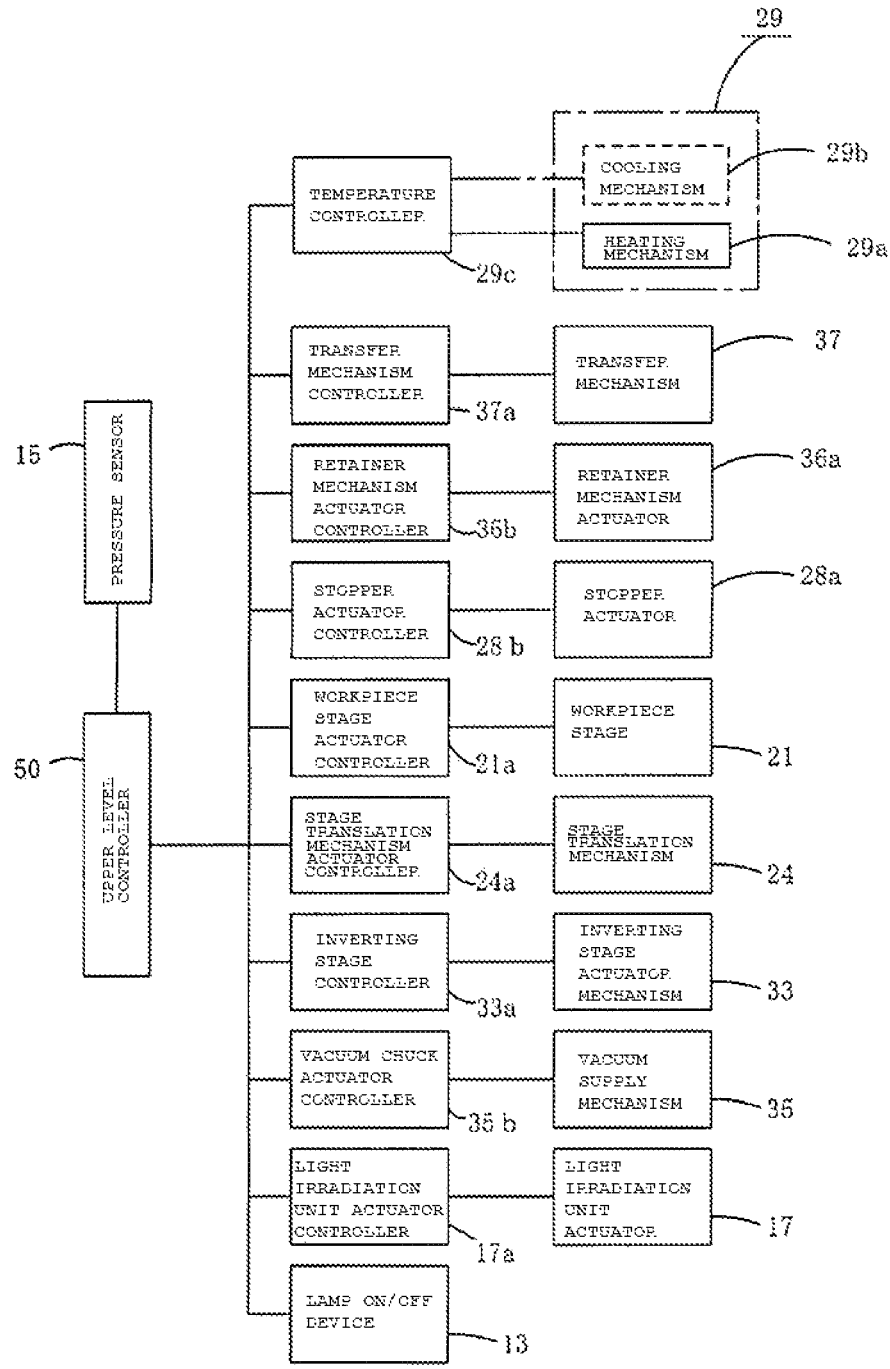
FIG. 11 is a view illustrating an example of the structure according to a modified example of the present invention which is provided with an upper level controller for controlling the execution timing of each control unit.

As described above, the operation of each component of the bonding apparatus is controlled, e.g., by the lamp ON/OFF device 13, the light irradiation unit actuator controller 17a, the light irradiation unit actuator 17, the vacuum chuck actuator controller 35b, the vacuum supply mechanism 35, the inverting stage controller 33a, the inverting stage actuator mechanism 33, the stage translation mechanism actuator controller 24a, the stage translation mechanism 24, the workpiece stage actuator controller 21a, the stopper actuator controller 28b, the stopper actuator 28a, the retainer mechanism actuator controller 36b, the retainer mechanism actuator 36a, the transfer mechanism controller 37a, the transfer mechanism 37, the temperature controller 29c, the heating mechanism 29a, and the cooling mechanism 29b, which are shown in FIGS. 1 to 4. However, as shown in FIG. 11, it is also possible to provide an upper level controller 50 as a controller for commanding the timing of executing each of these controllers and the like in order to automatically carry out a series of steps of the bonding apparatus of the present invention.

The upper level controller 50 pre-stores the contents of the commands concerning the procedure of each of [Step 1] to [Step 4] described above and controls each of the aforementioned controllers on the basis of the contents of the commands.

Note that the pressure sensor 15 shown in FIG. 9 detects the pressure applied to the first workpiece W1 and the second workpiece W2 and the resulting value is supplied, for example, to the stage translation mechanism actuator controller 24a as described above. However, when the upper level controller 50 is provided, the output from the pressure sensor 15 may be sent to the upper level controller 50 in order to control the stage translation mechanism actuator controller 24a via the upper level controller 50.

Note that when the first workpiece W1 and the second workpiece W2 are transferred onto, placed on, and transferred from the inverting stage 31 and the workpiece stage 21, respectively, using a known transfer mechanism, a controller for controlling such a transfer mechanism may be connected to the upper level controller 50.

The bonding apparatus illustrated in this embodiment has A. the light irradiation, workpiece stacking, and pressurizing mechanism, B. the workpiece transfer mechanism, and C. the workpiece heating mechanism, and thus may carry out [Step 1], [Step 2], [Step 3], and [Step 4] of the bonding method according to the present invention.

In particular, since the bonding apparatus is divided into three mechanisms as described above, the heating stage 29 of the workpiece heating mechanism can be pre-heated, so that after the workpieces are pressurized and then depressurized in [Step 3], the workpieces transferred to the heating stage 29 can be quickly heated.

Furthermore, in A. the light irradiation, workpiece stacking, and pressurizing mechanism, the surface of the first workpiece W1 to be irradiated with light and the surface of the second workpiece W2 to be irradiated with light can be adjusted to be generally flush with each other, and furthermore, the distance between these surfaces to be irradiated with light and the light irradiation unit 10 can be arbitrarily set.

For example, when the UV light with which the surface to be irradiated of both the workpieces is irradiated by the light irradiation unit 10 has a center wavelength of 172 nm, the distance between the lower side of the lamps and the irradiated surface of both the workpieces may be set, for example, to 1 to 5 mm. Therefore, when the workpieces are irradiated with UV light at a wavelength of 172 nm which is considerably attenuated in the atmosphere, the surface of the first workpiece W1 and the surface of the second workpiece W2 can be reformed even if the irradiation is carried out in the atmosphere. That is, since the irradiation with UV light needs not to be carried out in a vacuum in which the UV light at a wavelength of 172 nm is not attenuated, the entire apparatus can be made more compact.

Note that as described above, in this embodiment, the height adjustment spacer 34a serving as the gap setting mechanism can adjust the distance between the surface of the first workpiece W1 held on the inverting stage (the first stage) 31 and the light irradiation unit 10. Likewise, the height adjustment collar 26b serving as the gap setting mechanism can also adjust the distance between the surface of the second workpiece W2 held on the workpiece stage (the second stage) 21 and the light irradiation unit 10. That is, in this embodiment, the gap setting mechanisms can independently adjust the respective distances between the light irradiation unit 10 and the surface of the first workpiece W1 held on the inverting stage (the first stage) 31 and/or the surface of the second workpiece W2 held on the workpiece stage (second stage) 21.

II. Experiments on Bonding

Now, the present invention will be described in more detail in accordance with embodiments of the bonding method of the present invention. However, the present invention will not be limited by these embodiments.

[Experiment 1]

A plate-shaped workpiece made of polydimethylsiloxane (PDMS) and a glass workpiece were employed as a pair of workpieces, which were then joined together by the bonding method of the present invention. Note that as a comparison, like workpieces were joined together by the conventional bonding method in order to study the bonding strength of both the pairs of workpieces.

The shape of the workpieces is as follows.

Figure 12:
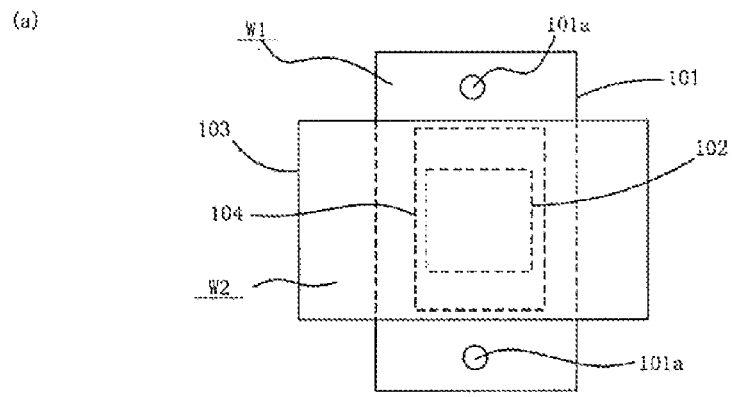
FIG. 12 is an explanatory view illustrating a bonding experiment.
Figure 12:
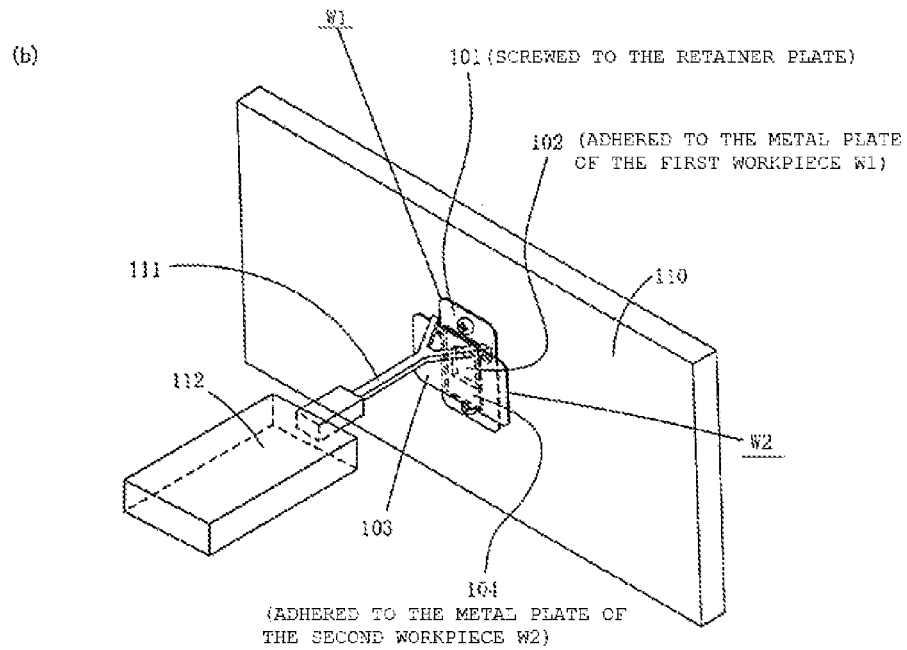

As shown in FIG. 12(a), the first workpiece W1 is a PDMS plate-shaped resin 102 of a thickness of 2 mm with length 10 mm×width 10 mm which is secured by an adhesive to a rectangular metal plate 101 of a thickness of 1 mm with length 30 mm×width 50 mm.

Meanwhile, the second workpiece W2 is a glass plate 104 of a thickness of 1 mm with length 15 mm×width 20 mm which is secured by an adhesive to a rectangular metal plate 103 of a thickness of 1 mm with length 30 mm×width 50 mm.

The plate-shaped resin portion of the first workpiece W1 and the glass plate portion of the second workpiece W2 were joined together.

The first workpiece W1 and the second workpiece W2 were joined together by the aforementioned bonding apparatus.

The experiment conditions were as follows.

[Step 1] The workpieces were irradiated with light emitted from an excimer lamp at a center wavelength of 172 nm. The distance D between the surface to be irradiated of the workpieces and the lower surface of the lamps was 3 mm; the irradiance on the workpiece surfaces was 10 mW/cm$^2$; and the irradiation time was 120 seconds.

[Step 2]

The light irradiated surfaces to be joined together were opposed to each other and stacked one on the other so that the surfaces to be joined together were brought into contact with each other. Both the surfaces were aligned using the positioning pins provided on the inverting stage 31 and the workpiece stage 21.

The surfaces were stacked one on the other so that the longitudinal directions of the rectangular metal plates 101 and 103 intersect as shown in FIG. 12(a). Note that the metal plate 101 for the first workpiece W1 is provided with through-holes 101a at two positions that do not overlap the second workpiece W2.

[Step 3]

The workpieces were pressurized at a pressure of 1 kgf/cm$^2$. The pressure was applied for 10 seconds, and subsequently, the pressure being applied was released.

[Step 4]

The workpieces were placed on the heating stage 29 that had been pre-heated to 150° C., and then taken out of the heating stage 29 after five seconds.

Note that as a comparative example, workpieces like the aforementioned ones were joined together by a bonding method, as disclosed in Patent Literature 3, which includes only a vacuum ultraviolet light irradiation step and a pressurizing step. Note that the experiment conditions were the same as those of [Step 1], [Step 2], and [Step 3] mentioned above.

A comparison was made to strengths between the workpieces that had been joined together by the two bonding methods mentioned above. The bonding strengths were measured by the following method.

As shown in FIG. 12(b), the first workpiece W1 and the second workpiece W2 that were joined together are secured to a retainer plate 110. More specifically, the first workpiece W1 and the second workpiece W2 that were joined to the retainer plate 110 are screwed thereto through threaded holes provided in the retainer plate 110 and the through-holes 101a provided in the first workpiece W1.

Next, the second workpiece W2 is hooked with a hook 111 attached to the tip of a push-pull gauge 112 and then pulled. Subsequently, the force at which the PDMS plate 102 of the first workpiece W1 and the glass plate 104 of the second workpiece W2 were disjoined and peeled off from each other was measured by the push-pull gauge 112, and the measured value was determined as the bonding strength.

The results are shown in the table below. Note that the experiment was carried out with four workpieces having the same specifications, in a manner such that two of the workpieces were joined together by the bonding method of the present invention and the remaining two were joined together by the conventional bonding method that included only the vacuum ultraviolet light irradiation step and the pressurizing step.

TABLE 1

| WORKPIECE NO. | BONDING METHOD | CONNECTION STRENGTH (N) |
|---|---|---|
| 1 | CONVENTIONAL METHOD [STEP 1] ⇒[STEP 2]⇒[STEP 3] | 26.7 |
| 2 | CONVENTIONAL METHOD [STEP 1] ⇒[STEP 2]⇒[STEP 3] | 22.6 |
| 3 | PRESENT INVENTION [STEP 1]⇒[STEP 2] ⇒[STEP 3] ⇒[STEP 4] | 49.0 |
| 4 | PRESENT INVENTION [STEP 1]⇒[STEP 2] ⇒[STEP 3] ⇒[STEP 4] | 47.6 |

As can be seen clearly from the results above, the bonding method according to the present invention which carries out up to [Step 4] provides a higher bonding strength. This is thought to be because the time required for the pressurizing step of [Step 3] was as short as 10 seconds, so that the conventional method which did not carry out [Step 4] caused the joined surfaces to noticeably include some regions sufficiently bonded together and the other regions insufficiently bonded together at the same time.

[Experiment 2]

Next, an appropriate range (the range of substrate temperatures) for heating in the heating step of [Step 4] was studied.

[Experiment 2-1]

The heating range (substrate temperature range) for a PDMS (polydimethylsiloxane) resin workpiece and a glass workpiece was studied.

The shapes of the workpieces are as follows.

The first workpiece is a PDMS plate-shaped resin having a thickness of 2 mm with length 10 mm×width 10 mm, and the second workpiece is a glass plate having a thickness of 1 mm with length 15 mm×width 20 mm. The first and second workpieces were joined together by the aforementioned bonding apparatus.

The experiment conditions were as follows.

[Step 1] The workpieces were irradiated with light emitted from the excimer lamps at a center wavelength of 172 nm. The distance D between the surface to be irradiated of the workpieces and the lower surface of the lamps was 3 mm (the same as with Experiment 1); the irradiance on the workpiece surfaces was 10 mW/cm$^2$; and the irradiation time was 300 seconds.

[Step 2]

The light irradiated surfaces to be joined together were opposed to each other and stacked one on the other so that the surfaces to be joined together were brought into contact with each other. Both the surfaces were aligned using the positioning pins provided on the inverting stage and the pressurizing stage.

[Step 3]

The workpieces were pressurized at a pressure of 1 kgf/cm$^2$. The pressure was applied for 10 seconds, and subsequently, the pressure being applied was released.

[Step 4]

The heating was carried out under the following four conditions.

(Condition 1) The substrates were at room temperature (i.e., not heated).

(Condition 2) The heating stage was pre-heated to 100° C., and the workpieces were placed on the pre-heated heating stage and then taken out of the heating stage after five seconds.

(Condition 3) The heating stage was pre-heated to 125° C., and the workpieces were placed on the pre-heated heating stage and then taken out of the heating stage after five seconds.

(Condition 4) The heating stage was pre-heated to 150° C., and the workpieces were placed on the pre-heated heating stage and then taken out of the heating stage after five seconds. The results are shown in Table 2 below.

TABLE 2

| CONDITION | HEATING TEMPERATURE (° C.) | RESULT OF BONDING |
|---|---|---|
| 1 | ROOM TEMPERATURE | x |
| 2 | 100 | ○ |
| 3 | 125 | ○ |
| 4 | 150 | ○ |

Here, the results of bonding were determined depending on whether both the workpieces were peeled off from each other by a pull test conducted by an operator.

Since the softening point of PDMS is 250° C. and the softening point of glass is typically 500° C. or higher, the appropriate temperature range for [Step 4] in this experiment is thought to be from 100° C. (inclusive) to 250° C. (exclusive).

[Experiment 2-2] The heating range (substrate temperature range) for a cyclic olefin copolymer (hereafter also referred to as COC) resin workpiece and a COC resin workpiece was studied.

The shapes of the workpieces are as follows.

The first workpiece is a COC plate-shaped resin having a thickness of 2 mm with length 10 mm×width 10 mm, and the second workpiece is a COC plate-shaped resin having a thickness of 2 mm with length 10 mm×width 10 mm. The first and second workpieces were joined together by the aforementioned bonding apparatus.

The experiment conditions were as follows.

[Step 1] The workpieces were irradiated with light emitted from the excimer lamps at a center wavelength of 172 nm. The distance D between the surface to be irradiated of the workpieces and the lower surface of the lamps was 2.6 mm; the irradiance on the workpiece surfaces was 5 mW/cm$^2$; and the irradiation time was 300 seconds.

[Step 2]

The light irradiated surfaces to be joined together were opposed to each other and stacked one on the other so that the surfaces to be joined together were brought into contact with each other. Both the surfaces were aligned using the positioning pins provided on the inverting stage and the pressurizing stage.

[Step 3]

The workpieces were pressurized at a pressure of 10,000 Pa. The pressure was applied for 10 seconds, and subsequently, the pressure being applied was released.

[Step 4]

The heating was carried out under the following four conditions.

(Condition 1) The substrates were at room temperature (i.e., not heated).

(Condition 2) The heating stage was pre-heated to 60° C., and the workpieces were placed on the pre-heated heating stage and then taken out of the heating stage after 120 seconds.

(Condition 3) The heating stage was pre-heated to 70° C., and the workpieces were placed on the pre-heated heating stage and then taken out of the heating stage after 120 seconds.

(Condition 4) The heating stage was pre-heated to 87° C., and the workpieces were placed on the pre-heated heating stage and then taken out of the heating stage after 120 seconds.

The results are shown in the table below.

TABLE 3

| CONDITION | HEATING TEMPERATURE (° C.) | RESULT OF BONDING |
|---|---|---|
| 1 | ROOM TEMPERATURE | x |
| 2 | 60 | ○ |
| 3 | 70 | ○ |
| 4 | 87 | ○ |

Here, the results of bonding were determined depending on whether both the workpieces were peeled off from each other by a pull test conducted by an operator.

From the results above, the appropriate temperature range for [Step 4] in this experiment is thought to be from 60° C. to 87° C. (both inclusive). Since the softening point of COC is 87° C., the appropriate temperature range is thought to be from [the softening point of COC minus 10 degrees] to the softening point of COC (both inclusive).

[Experiment 2-3]

The heating range (substrate temperature range) for a cyclo olefin polymer (hereafter also referred to as COP) resin workpiece and a COP resin workpiece was studied.

The shapes of the workpieces are as follows.

The first workpiece is a COP plate-shaped resin having a thickness of 2 mm with length 10 mm×width 10 mm, and the second workpiece is a COP plate-shaped resin having a thickness of 2 mm with length 10 mm×width 10 mm. The first and second workpieces were joined together by the aforementioned bonding apparatus.

The experiment conditions were as follows.

[Step 1] The workpieces were irradiated with light emitted from the excimer lamps at a center wavelength of 172 nm. The distance D between the surface to be irradiated of the workpieces and the lower surface of the lamps was 2.6 mm; the irradiance on the workpiece surfaces was 5 mW/cm$^2$; and the irradiation time was 300 seconds.

[Step 2]

The light irradiated surfaces to be joined together were opposed to each other and stacked one on the other so that the surfaces to be joined together were brought into contact with each other. Both the surfaces were aligned using the positioning pins provided on the inverting stage and the pressurizing stage.

[Step 3]

The workpieces were pressurized at a pressure of 10,000 Pa. The pressure was applied for 10 seconds, and subsequently, the pressure being applied was released.

[Step 4]

The heating was carried out under the following four conditions.

(Condition 1) The substrates were at room temperature (i.e., not heated).

(Condition 2) The heating stage was pre-heated to 127° C., and the workpieces were placed on the pre-heated heating stage and then taken out of the heating stage after 120 seconds.

(Condition 3) The heating stage was pre-heated to 132° C., and the workpieces were placed on the pre-heated heating stage and then taken out of the heating stage after 120 seconds.

(Condition 4) The heating stage was pre-heated to 137° C., and the workpieces were placed on the pre-heated heating stage and then taken out of the heating stage after 120 seconds.

The results are shown in the table below.

TABLE 4

| CONDITION | HEATING TEMPERATURE (° C.) | RESULT OF BONDING |
|---|---|---|
| 1 | ROOM TEMPERATURE | x |
| 2 | 127 | ○ |
| 3 | 132 | ○ |
| 4 | 137 | ○ |

Here, the results of bonding were determined depending on whether both the workpieces were peeled off from each other by a pull test conducted by an operator.

From the results above, the appropriate temperature range for [Step 4] in this experiment is thought to be from 127° C. (exclusive) to 137° C. (inclusive). Since the softening point of COP is 137° C., the appropriate temperature range is thought to be from [the softening point of COP minus 10 degrees] to the softening point of COP (both inclusive).

REFERENCE SIGNS LIST

10 Light irradiation unit
10a Lamp housing
11a UV lamp
11b Reflective mirror
13 Lamp ON/OFF device
15 Pressure sensor
17 Light irradiation unit actuator
17a Light irradiation unit actuator controller
20 Pressurizing stage unit
21 Workpiece stage
21a Work stage actuator controller
22 Auxiliary stage
23 Pressurizing stage
24 Stage translation mechanism 24a Stage translation mechanism actuator controller
25 Actuator shaft
26 Pillar
26a Flange
26b Height adjustment collar
27 Spring
27a Spring case
28 Stopper
28a Stopper actuator
28b Stopper actuator controller
29 Heating stage
29a Heating mechanism
29b Cooling mechanism
29c Temperature controller
30 Inverting stage unit
31 Inverting stage
31a Vacuuming groove
31b Vacuum supply hole
31c Positioning pin
32 Stage retainer mechanism
33 Inverting stage actuator mechanism
33a Inverting stage controller
33b Shaft
33c Coupling
33d Bearing
33e Rotating shaft
34 Inverting stage base
34a Height adjustment spacer
35 Vacuum supply mechanism
35a Vacuum supply pipe
35b Vacuum chuck actuator controller
36 Inverting stage retainer mechanism
36a Retainer mechanism actuator
36b Retainer mechanism actuator controller
37 Transfer mechanism
37a Transfer mechanism controller
41 Base
50 Upper level controller
101, 103 Metal plate
101a Through-hole
102 PDMS plate
104 Glass plate
111 Hook
112 Push-pull gauge
W, W1, W2 Workpiece

The invention claimed is:

1. A method for bonding workpieces wherein a first workpiece made of resin and a second workpiece made of resin or glass are bonded together, the method comprising:
   irradiating at least one of surfaces to be bonded together of either one of the first and second workpieces with ultraviolet light;
   after the irradiation with the light, stacking both the first and second workpieces one on the other so that the surfaces of the first and second workpieces to be bonded together are directly brought into contact with each other;
   applying pressure to both the first and second workpieces so as to pressurize the contact surfaces for a predetermined time;
   releasing the pressure being applied after the predetermined time has elapsed from start of applying the pressure;
   after the pressure being applied is released, heating both the first and second workpieces to a predetermined temperature of the workpieces; and
   holding the temperature for a predetermined time until the workpieces are joined together.

2. The method for bonding workpieces according to claim 1, wherein both the first and second workpieces are heated by heating means, and the heating means is pre-heated.

3. The method for bonding workpieces according to claim 1, wherein both the first and second workpieces are microchip substrates, and at least one of the first and second workpieces is provided with a fine flow path.

4. An apparatus for bonding workpieces wherein a first workpiece made of resin and a second workpiece made of resin or glass are bonded together, the apparatus comprising:
   a first stage for holding the first workpiece, which is rotatable by 180 degrees about a shaft provided on one end thereof;
   a second stage for holding the second workpiece;
   a light irradiation unit for irradiating a surface of the first workpiece and a surface of the second workpiece with ultraviolet light, wherein the light irradiation unit accommodates lamps;
   a workpiece stacking mechanism for stacking in layers both the first and second workpieces by rotating the first stage by 180 degrees so that the light-irradiated surface of the first workpiece held on the first stage is brought into contact with the light-irradiated surface of the second workpiece held on the second stage, wherein the surface of the first workpiece is irradiated with the ultraviolet light before the first stage is rotated by 180 degrees;
   a movement restricting mechanism for restricting at least a vertical movement of the first and second workpieces stacked in layers;
   a pressurizing mechanism for pressurizing the first and second workpieces stacked in layers in a state that the contact surfaces thereof are pressurized;
   a gap setting mechanism capable of setting a distance between a lower side of the lamps and the surface of the first workpiece held on the first stage and the surface of the second workpiece held on the second stage, to 1 to 5 mm, wherein the first stage and the second stage are adjusted independently of each other; and
   a heating mechanism which is provided separately from the first and second stages and which, after the pressure being applied is released, heats the first and second workpieces stacked in layers.

5. The apparatus for bonding workpieces according to claim 4, wherein the heating mechanism is constituted by a heating stage on which the first and second workpieces are placed.

6. The apparatus for bonding workpieces according to claim 4, wherein both the first and second workpieces are microchip substrates, and at least one of the first and second workpieces is provided with a fine flow path.

7. An apparatus for bonding workpieces wherein a first workpiece made of resin and a second workpiece made of resin or glass are bonded together, the apparatus comprising:
   a first stage for holding the first workpiece, which is rotatable about a shaft provided on one end thereof;
   a second stage for holding the second workpiece;
   a light irradiation unit for irradiating, with ultraviolet light, a surface of the first workpiece held on the first stage, wherein the light irradiation unit accommodates lamps;
   a workpiece stacking mechanism for stacking in layers both the first and second workpieces by rotating the first stage by 180 degrees so that at least the light-irradiated surface of the first workpiece held on the first stages is brought into contact with the surface of the second workpiece held on the second stage, wherein the surface of the first workpiece is irradiated with the ultraviolet light before the first stage is rotated by 180 degrees;

a movement restricting mechanism for restricting at least a vertical movement of the first and second workpieces which are stacked in layers;

a pressurizing mechanism for pressurizing the first and second workpieces stacked in layers so that the contact surfaces thereof are pressurized;

a gap setting mechanism capable of setting a distance between a lower side of the lamps and the surface of the first workpiece held on the first stage to 1 to 5 mm; and a heating mechanism which is provided separately from the first and second stages and which, after the pressure being applied is released, heats the first and second workpieces stacked in layers.

8. An apparatus for bonding workpieces wherein a first workpiece made of resin and a second workpiece made of resin or glass are bonded together, the apparatus comprising:

a first stage for holding the first workpiece, which is rotatable about a shaft provided on one end thereof;

a second stage for holding the second workpiece;

a light irradiation unit for irradiating, with ultraviolet light, a surface of the second workpiece held on the second stage, wherein the light irradiation unit accommodates lamps;

a workpiece stacking mechanism for stacking in layers both the first and second workpieces by rotating the first stage by 180 degrees so that at least the surface of the first workpiece held on the first stage is brought into contact with the surface of the second workpiece held on the second stage, wherein the surface of the second workpiece is irradiated with the ultraviolet light before the first stage is rotated by 180 degrees;

a movement restricting mechanism for restricting at least a vertical movement of the first and second workpieces which are stacked in layers;

a pressurizing mechanism for pressurizing the first and second workpieces stacked in layers so that the contact surfaces thereof are pressurized;

a gap setting mechanism capable of setting a distance between a lower side of the lamps and the surface of the second workpiece held on the second stage to 1 to 5 mm; and a heating mechanism which is provided separately from the first and second stages and which, after the pressure being applied is released, heats the first and second workpieces stacked in layers.

* * * * *